United States Patent [19]

Moore et al.

[11] Patent Number: 4,551,815

[45] Date of Patent: Nov. 5, 1985

[54] FUNCTIONALLY REDUNDANT LOGIC NETWORK ARCHITECTURES WITH LOGIC SELECTION MEANS

[75] Inventors: Donald W. Moore; Rick A. Verstraete, both of Los Angeles, Calif.

[73] Assignee: Aerojet-General Corporation, La Jolla, Calif.

[21] Appl. No.: 589,943

[22] Filed: Mar. 15, 1984

Related U.S. Application Data

[63] Continuation-in-part of Ser. No. 560,109, Dec. 12, 1983.

[51] Int. Cl.$^4$ .......................................... H03K 19/003
[52] U.S. Cl. ..................................... 364/716; 307/465
[58] Field of Search ..................... 364/716; 307/465; 371/11

[56] References Cited

U.S. PATENT DOCUMENTS

| | | | |
|---|---|---|---|
| 3,291,974 | 12/1966 | Even | 364/716 |
| 3,296,424 | 1/1967 | Cohn | 364/716 |
| 3,619,583 | 11/1971 | Arnold | 364/716 |
| 4,380,811 | 4/1983 | Götze et al. | 307/465 |
| 4,418,410 | 11/1983 | Goetze et al. | 371/15 |

Primary Examiner—David H. Malzahn
Attorney, Agent, or Firm—Leonard Tachner

[57] ABSTRACT

A programmable gate structure having functionally redundant architecture for enhanced production yields and reliability comprises a plurality of two-input nodes at least some of which may be programmed by control states for changing the logical function of the gate structure. Redundancy is provided by gate structure implementations in which the number of possible control states exceed the number of logic functions expected of the gate structure. Redundancy increases the probability of gate structure operation despite logic faults and renders the gate structure suitable for reprogramming in response to detected faults to achieve a desired gate function.

A number of embodiments are disclosed including selected architectural simplifications wherein certain nodes in a network are logically fixed to reduce the number of control lines. Illustrative computer programs for generating the proper control line signals for a selected gate function in such embodiments are disclosed.

18 Claims, 19 Drawing Figures

FUNCTIONALLY REDUNDANT LOGIC NETWORK ARCHITECTURES WITH LOGIC SELECTION MEANS

BACKGROUND OF THE INVENTION

This application is a continuation-in-part of patent application Ser. No. 560,109 filed Dec. 12, 1983.

FIELD OF THE INVENTION

This invention relates generally to the field of state machine logic and more specifically, to a modular, logically redundant, multiple input gate in the form of a high speed, low power field programmable logic array in which Boolean logic functions can be programmed by the user despite the presence of component faults, thereby increasing production yields and network reliability.

PRIOR ART

The desirability of an integrated circuit logic device which can realize any logical function of a fixed number of variables is well-known in the art. The capability of a logic device for implementing all possible Boolean functions of its variables is in this description called "completeness". For a gate with N input variables, the number of different Boolean functions is equal to 2 raised to the power of 2 to the power N. A gate would therefore be complete if it can be set to any of this set of logic functions. Gates with similar properties have been called universal. However, this term usually means that all the set of such functions can be accommodated with a given set of gates. Thus, universal is more a term on the level of applications, i.e., which or how many functions can be implemented. Completeness is a term about capabilities and the relevant parameter is the number of input variables not the maximum number of functions. Universal logic circuits are discussed in prior art literature including an article entitled "Universal Logic Circuits and Their Modular Realizations" by S. S. Yau and C. K. Tang at pages 297–305 of the 1968 Spring Joint Computer Conference proceedings. The desirability of producing a multipurpose logic circuit for performing all or virtually all discrete logical combinations of a given number of variables, has resulted in a number of relevant prior art patents. For example, U.S. Pat. No. 3,428,903 to Forslund et al discloses a logic block said to be capable of performing 254 out of 256 discrete logical combinations of three variables and an earlier patent to the same inventors, namely, U.S. Pat. No. 3,381,117 discloses a particular logic circuit embodiment which is said to be capable of performing all 256 logic functions of a three input device. The following additional patents are deemed to be relevant in varying degrees to the completeness feature of this invention:

U.S. Pat. No. 3,987,286, Muehldorf
U.S. Pat. No. 4,034,356, Hawley, et al
U.S. Pat. No. 4,053,793, Ernst, et al
U.S. Pat. No. 4,292,548, Suarez, et al
U.S. Pat. No. 4,366,601, Tanaka
U.S. Pat. No. 4,348,737, Cukier, et al.

A functionally selectable gate is quite simply a logic gate which presents a particular Boolean logic function to the input variables as determined by the user. Accordingly, in addition to the input variable lines and the output line, a plurality of control lines are also required to provide means for selecting a particular function. Usually, a different state of control lines results in a different function being performed. Redundancy means that one or more control states may be omitted without loss of functional capabilities. This implies that certain or all internal states of the gate can be obtained by different settings of the control lines or equivalently, that changing the control lines will not necessarily change the behavior of the gate. For a complete logic architecture, redundancy is implied if there are more than the minimum number of required control lines to select all possible Boolean logic functions for the number of input variables. Thus, if a complete gate has more than two to the power N control lines where N equals the number of input variables, then redundancy is implied. An incomplete gate can be redundant by introducing more control lines without new Boolean functions. There is a trade-off between the level of completeness and the level of redundancy. For a given number of control lines one has the option of either a highly complete but non-redundant gate or a less complete but redundant gate. For example, a complete but non-redundant logic gate has exactly one control state for every one of its possible Boolean logic functions. Alternatively, one could design the gate so that the control states come in pairs which specify identical functional states. This would make the logic gate 50% complete but 100% redundant. By the same token, for a given number of external lines, namely, control lines and input variable lines, one has the option of many variables with little control which would render the gate incomplete or many control lines with few variables which would render the gate complete and redundant. There is a whole spectrum of gates between the trivial limits of 0% complete where all input lines are variables and not controls and 100% complete and redundant where all lines are controlled and the gate has no variables.

An important advantage of redundancy is fault tolerance. If one certain state of the control lines does not give the proper behavior due to a fault, it may very well be possible that onther control settings for the same Boolean function still accomplish the desired response in the logic gate. The degree to which redundancy renders a logic gate fault tolerant, depends to a great extent upon the nature and location of the fault within the logic gate. However, in general terms the probability that in a redundant logic gate all the equivalent control states are faulty is significantly smaller than is the probability of failure in a non-redundant gate in which a fault is present.

The closest prior art of which the applicants are currently aware is a multiplexer tree described by Yau. However, there are several critical distinctions between the invention herein disclosed and the Yau mux tree. One fundamental difference is that the Yau mux tree is a hierarchial array in which all the control signals are entered at the lowest level of the hierarchy while the data input variables are applied to each level of the hierarchy. However, in the present invention it will be seen that the control signals are applied to each node independently of the other nodes in the array and the data input variables are applied only to the lowermost array layer. As a result, the network of the present invention can be made functionally redundant while the Yau mux tree can not. Consequently, the Yau mux tree is not fault tolerant. Furthermore, the Yau mux tree does not lend itself to a large number of alternative solutions to a problem which seeks the presentation of a specific Boolean logic function to the input data variables. As a result, unlike the present invention, the Yau mux tree is not capable of being programmed to provide a desired function despite the presence of faults.

SUMMARY OF THE INVENTION

The logic device of the present invention performs computational logic functions suitable to concurrent or serial logic machines. It applies to any computer application in which reliability and increased production yield is a requirement. It is also particularly amenable to VLSI architectures and full component testability that solves the well-known VLSI buried logic problem. One illustrative novel test method for fully testing a particular configuration employing the present invention is disclosed and claimed in copending patent application Ser. No. 553,571 filed Nov. 21, 1983 by one of the inventors herein. Related subject matter is also disclosed in copending Patent Application Ser. No. 560,109 filed Dec. 12, 1983. The invention is logically flexible thus overcoming the limitations of fixed logic arrays. The invention is programmable. It can be reprogrammed during use to suit the user's application while having none of the computational speed or power consumption penalties of conventional field programmable logic arrays. Furthermore, the invention can be manufactured, programmed and completely tested as a standard, high volume VLSI product having the advantages of high speed and low power consumption and can be reprogrammed during production to overcome faults thereby increasing yield.

More importantly the present invention comprises a logic device which provides a functionally redundant architecture with a substantially enhanced probability of functionality despite the presence of faults, thus rendering the device more reliable in the field and more likely to provide greater production yields. Functionally redundant architecture may be defined as a device having at least one more configuration than the number of possible transform functions. Furthermore, programming may be carried out by non-design personnel who need only specify their desired logic function in either minterm expressions, Boolean expressions or as "Well Formed Formulas".

In one illustrative embodiment of the present invention, the logic structure comprises a combinational logic device in the form of a complete gate structure. The device is a three-input gate constructed from six two-variable input gates. The device architecture has a regular structure with a hierarchial form. The general purpose quality of the device is derived from the ability of the gate structure to be configurable into all of the possible 256 functions of a three input device. The embodiment is therefore complete in the sense that it can assume any and all possible Boolean functions by a combinational device with up to three inputs. The structure is composed of six two-variable input gates called nodes or atoms. Each input gate is identical and is in itself complete.

At the two-input level, completeness means the ability to recognize all sixteen possible logic functions for two inputs. In this embodiment the multiple logic states that a node or atom may assume are selected by a control structure in the form of a 4-bit control word. When the atom is used as a combinational logic device, a fixed control word establishes the desired function. At this level of control, a simple scheme is available for structuring field programmable logic arrays (FPLA) with qualities of speed and normal power. On the other hand, conventional FPLA design establishes logical options by incorporating into the data path all of the expected logic options and blowing fuses to select specific options. The resultant loading of the data path by the fuse and logic circuitry degrades performance. The atom maintains a parsimonious data path and appends the control structure. Control structure design is independent of data path quality features. The atom may be arranged in structures that provide for inputs greater than two in other embodiments.

A number of embodiments are disclosed herein comprising certain preselected architectural simplifications referred to as diamond networks where atoms or nodes in a particular array are fixed whereby the total number of control lines is reduced thereby reducing redundancy while maintaining completeness. Specific programs are disclosed as examples for permitting a user to easily determine the control words for selected network functions for such diamond networks.

OBJECTS OF THE INVENTION

It is therefore a principal object of the present invention to provide a programmable combinational logic device which has a functionally redundant architecture for rendering the device fault tolerant thereby increasing reliability and increasing production yields.

It is an additional object of the present invention to provide a programmable state machine logic device which comprises a hierarchial array of atoms at least some of which may be reconfigured by the logic states of a plurality of control signals to present in a number of different ways a Boolean logic function to the input variables of the network.

It is still an additional object of the present invention to provide a readily programmable gate network that can be reconfigured to provide any selected logic function for a given number of input variables by simply specifying a user function as a minterm expression, Boolean expression or as a "well-formed formula".

It is still an additional object of the present invention to provide a fault-tolerant gate network that may be automatically programmed in response to fault detection testing during production to provide a desired Boolean function irrespective of detected faults.

BRIEF DESCRIPTION OF THE DRAWINGS

The aforementioned objects and advantages of the present invention as well as additional objects and advantages thereof will be more fully understood hereinafter as a result of a detailed description of preferred embodiments of the invention when taken in conjunction with the following drawings in which.

DETAILED DESCRIPTION OF PREFERRED EMBODIMENTS

Figure 1:
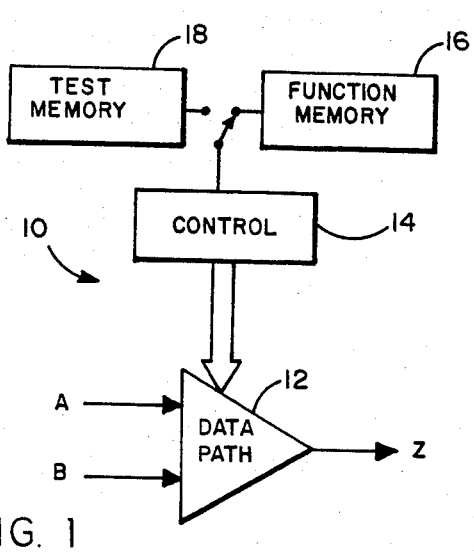
FIG. 1 is a block diagram of a unitary node or atom of the invention configured for test or function as selected by a user.

FIG. 1 illustrates a basic building block or atom 10 of the logic network of the invention. It is a six input device comprising two variable data inputs and four control line inputs. Consequently, it is a complete logic device, meaning that it has the maximum computing power for two input variables. In the symbolic block diagram of FIG. 1 atom 10 comprises a data path 12, a control apparatus 14, a function memory 16 and a test memory 18. Input variables A and B are applied to data path 12 which in turn produces an output Z. The output Z is a Boolean function of the input variables A and B determined in accordance with the output of control apparatus 14. Control apparatus 14 provides four control lines carrying a selected combination of four binary signals which determine the Boolean function of data path with respect to the input variables A and B. The provision of four such control lines from control apparatus 14 permits the application of sixteen binary combinations to data path 12 thereby allowing data path 12 to assume all possible sixteen Boolean functions for two input variables. These sixteen Boolean functions are listed in and represented by the Karnaugh Map shown in Table I.

TABLE I

| BOOLEAN EXPRESSION | KARNAUGH MAP | CONTROL CODE C3 C2 C1 C0 | KEY TO TABLE X |
|---|---|---|---|
| 0 | | 0 0 0 0 | 0 |
| X1 · X2 | | 0 0 0 1 | 1 |
| $\overline{X1}$ · X2 | | 0 0 1 0 | 4 |
| X2 | | 0 0 1 1 | 5 |
| $\overline{X1}$ · $\overline{X2}$ | | 0 1 0 0 | 8 |
| X1 · X2 + $\overline{X1}$ · $\overline{X2}$ | | 0 1 0 1 | 9 |

TABLE I-continued

| BOOLEAN EXPRESSION | KARNAUGH MAP | CONTROL CODE C3 C2 C1 C0 | KEY TO TABLE X |
|---|---|---|---|
| $\overline{X1}$ | | 0 1 1 0 | C |
| $\overline{X1}$ + X2 | | 0 1 1 1 | D |
| X1 · $\overline{X2}$ | | 1 0 0 0 | 2 |
| X1 | | 1 0 0 1 | 3 |
| X1 · $\overline{X2}$ + $\overline{X1}$ · X2 | | 1 0 1 0 | 6 |
| X1 + X2 | | 1 0 1 1 | 7 |
| $\overline{X2}$ | | 1 1 0 0 | A |
| X1 + $\overline{X2}$ | | 1 1 0 1 | B |
| $\overline{X1}$ + $\overline{X2}$ | | 1 1 1 0 | E |
| 1 | | 1 1 1 1 | F |

As seen in FIG. 1 the actual control apparatus output may be controlled by either a function memory 16 or a test memory 18. Typically the function memory 16 places control apparatus 14 in a suitable control mode for providing data path 12 with a selected Boolean function for input variables A and B. However, function memory 16 may be selectively re-programmed as required to change the output of control apparatus 14 in accordance with an alternative selection for the Boolean function of data path 12. On the other hand, test memory 18 would typically be provided with capability for cycling control apparatus 14 through all possible control signal combinations in a sequential fashion for the purpose of generating all Boolean functions for data path 12 during a test of the atom 10.

Figure 2:
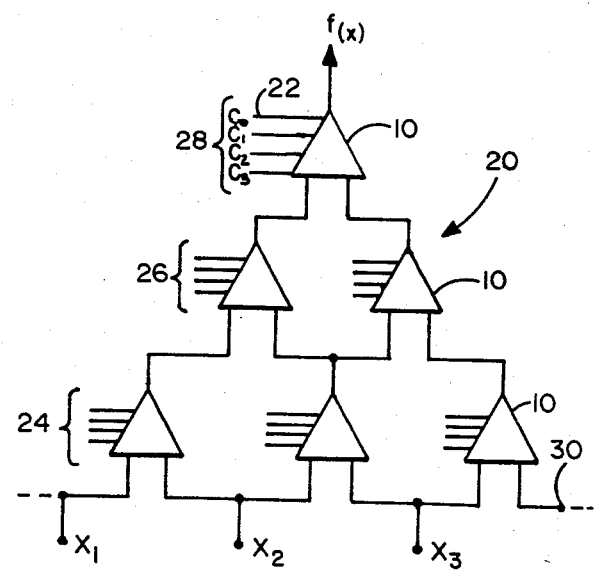
FIG. 2 is a schematic block diagram of a three variable gate structure embodiment of the invention utilizing six of the atoms or nodes of FIG. 1.

Referring to FIG. 2 there is shown therein an illustrative general purpose gate 20 which is a combinational logic device in the form of a complete gate structure. The device is a three-variable input gate structured from six two-variable input gates or atoms 10. The device architecture has a regular structure with a hierarchial form. The general purpose quality of the device derives from the ability of the gate structure to be configurable into all of the possible 256 truth-table values of a three input device. The gate structure 20 is thus "complete" in the sense that it can assume any and all possible Boolean functions as a combinational device with three inputs. As previously discussed in conjunction with FIG. 1, each two-variable input gate or atom 10 is identical and is in itself complete. The bottom tier 24 of atoms 10 comprises three such atoms which are adapted to receive input variables X1, X2 and X3 and provide connection to the next highest tier 26 of two atoms 10 which is in turn connected to a highest tier 28 of a single atom 10. The output signal of single atom 10 comprising tier 28 is f(x), a Boolean function of the three input variables X1, X2 and X3. It is to be noted that the right-most input line 30 of the right-most atom 10 of tier 24 is connected to the left-most input line of the left-most atom 10 of that tier to provide for three input variables. It is also to be noted that each atom 10 includes provision for four control lines C0, C1, C2 and C3. Each such set of control lines is connected to a source of control code signals. This feature is discussed hereinafter in conjunction with FIG. 3.

Reference will now be made to FIGS. 3-6 for a more detailed description of an actual integrated circuit implementation of one illustrative embodiment of the present invention. More specifically, referring first to FIG. 3 it will be seen that the actual implementation of each atom or two-variable input gate structure of the present invention comprises a logical unit 40, a decode programmable logic array (PLA) 42, a static shift register (SSR) 44, and a two phase clock generator 46.

Figure 4:
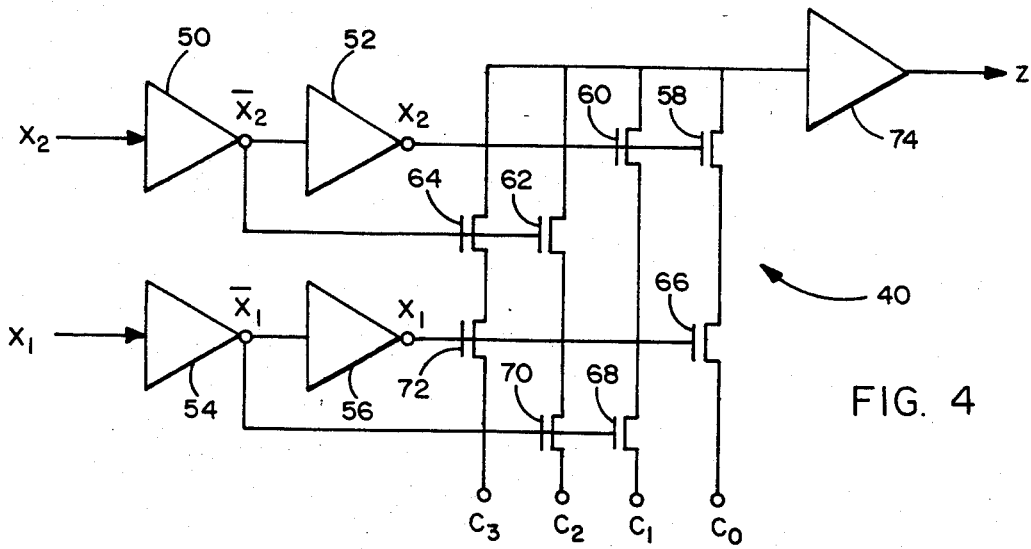
FIG. 4 is a schematic diagram of a specific gate structure of a node or atom of the present invention shown in accordance with a preferred embodiment that has been reduced to practice.

Logic unit 40 is shown in detail in FIG. 4. As seen in FIG. 4 the logic unit 40 is driven by inverting supper buffers 50, 52, 54 and 56 and a non-inverting super buffer 74 to ensure maximum speed in the input/output logic circuit. Each of the inverting input buffers drives the gate of each of two field effect transistors (FET). Control signals C0–C3 provide the source voltages and the drains are tied either serially or directly to common input/output super buffer 74. In this manner the logic condition of the control signals C0–C3 determines which one of the possible Boolean functions of input variables X1 and X2 will produce the Z output. Thus, for example, if only C0 were in a logical one condition and the remaining control signals were all at logical zero conditions, Z would attain a logic one state only if both X1 and X2 input variables were at a logical one state. Therefore, in this condition, logic unit 40 would act as an AND gate. On the other hand, if control signals C0, C1 and C3 were in a logic one condition and only C2 were in a logic zero condition, the Z output would be in a logic one condition if either X1 or X2 or both were in a logic one condition. Therefore, in this mode of control, logic unit 40 would behave as an OR gate. Whenever the control signals C0–C3 are fixed, the logic unit is the only portion of the atom implicated in signal handling.

Control signals for the logic unit 40 are derived from a static shift register 44 and a programmed logic array 42. This combination provides a means to change the control signal and to remember the last signal, thus comprising a form of memory. SSR 44 comprises up to eight register segments and so may be shifted sequentially into eight states by a clock signal CLK. The eight states are decoded by the PLA 42 into sixteen unique signals for sixteen clock transitions by a NAND portion of the PLA. A NOR portion of the PLA 42 converts the sixteen signals out of the SSR 44 into as many four-bit binary words that act as the control signals for the logic unit. SSR 44 is a conventional device comprising sixteen inverting super buffers arranged in a ring with the output of the last stage being inverted to be looped back to the SSR input. Each inverter drives an input to the PLA NAND section. In this manner, the SSR provides the needed complements to the eight inverter segments. The pass-transistors that operate the register of SSR 44 are clustered at the input to each segment. In this way, the speed of the circuit is improved and the hazard of faulty logic due to capacitive voltage is minimized.

The PLA is sparsely populated with transistors; i.e., only two per inverter signal (32 total). This low population permits distribution of the transistors toward the drive parts and reduced PLA capacitance. A non-overlapping clock utilizes the capacity of two distribution buses CLOCK and NON-CLOCK to slow clock transitions in proportion to the chip distributed capacity ensuring that all the register gates are at correct potentials during shifting. This precaution is included to avoid "racing" in the SSR. The clock generation circuit is a familiar two NOR gate five inverter design. Super buffers are used to drive the clock buses, provide somewhat equal rise and fall times and also facilitate a clock slow-down function.

Figure 3:
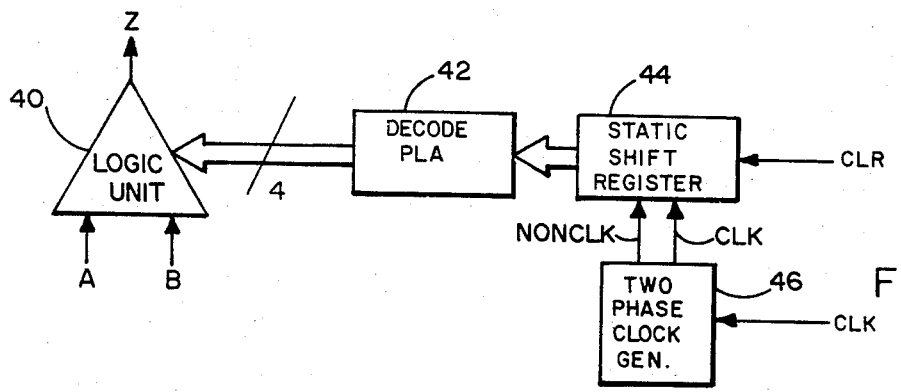
FIG. 3 is a block diagram of a node or atom of the present invention configured specifically in accordance with the preferred embodiment that has been reduced to practice.
Figure 5:
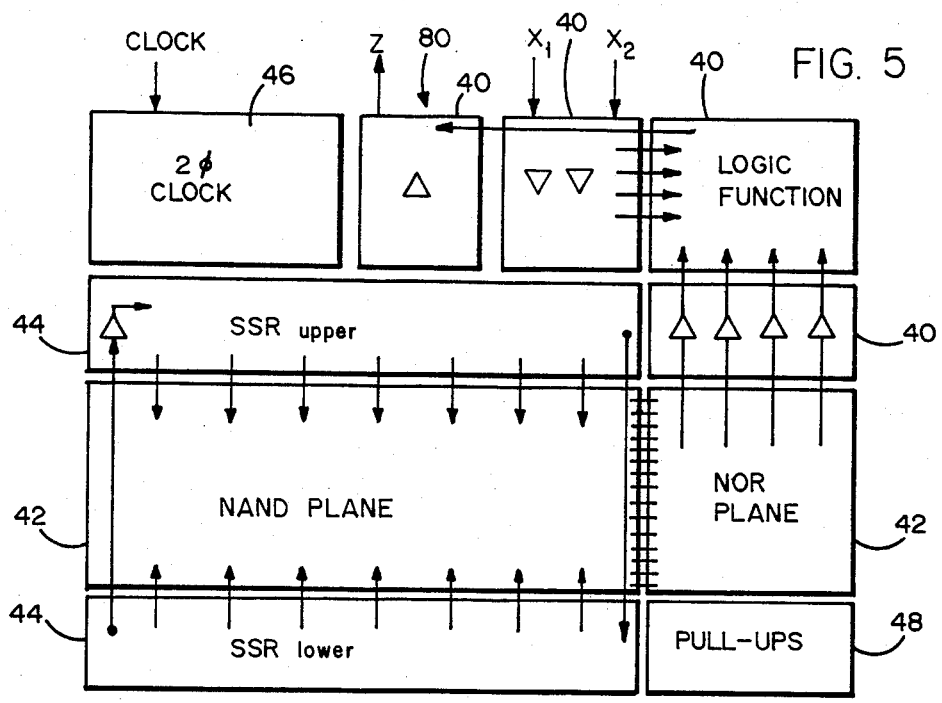
FIGS. 5 and 6 are floor plan layout drawings respectively of an atom or node of the invention and of an entire chip incorporating dual sets of six such atoms.
Figure 6:
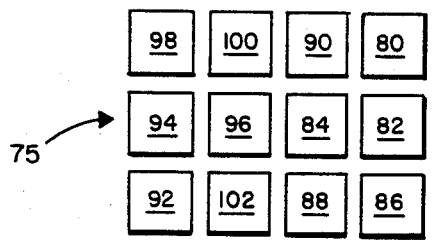

Floor plan drawings of the replicated two input atom 10 incorporating the SSR/PLA configuration of FIG. 3 and of an entire chip incorporating two complete gate networks 20 of FIG. 2, are shown respectively in FIGS. 5 and 6. The layout of gate 10 is determined largely by the PLA shape. PLA size is determined by the spacing of the super buffers and switching transistor networks that drive the PLA. The design of the chip floor plan is based upon the replication and interconnection of the basic two input gates in groups of six with two such groups being incorporated on a single chip. The resultant chip size is approximately 4×5 mils including 36 pads. As seen in FIG. 5 the reference numerals applied to the layout of the atom or two input logic gate indicate the correspondence between the floor plan location and the functional block discussed previously in conjunction with FIG. 3. The only portion of the floor plan of FIG. 5 not previously identified comprises a plurality of pull-up resistors 48 shown in the lower right-hand of that figure. Thus, the floor plan of the two input logic gate generally identified by reference numeral 80 as shown in FIG. 5, comprises four portions which make up the logic unit 40, two portions including a NAND plane and a NOR plane which make up PLA 42, two portions including an upper SSR portion and a lower SSR portion which make up static shift register 44 and a single portion which comprises the two phase clock 46 along with the previously mentioned pull-up resistors portion 48.

An entire network of gates is shown in FIG. 6 in the layout of a chip 75 wherein the two input gate portion 80 is located in the upper right-hand corner of the floor plan of the entire chip. Two input gate 80 forms the upper-most hierarchial chip of a first group comprising additional atoms 82, 84, 86, 88 and 90, which, in combination, provide a complete three-variable input logic gate structure as shown in FIG. 2. The chip 75 also comprises a second such three-variable input gate structure comprising atoms 92, 94, 96, 98, 100 and 102 with atom 92 forming the upper-most level of the hierarchial structure of that group.

Functional redundancy of a logic network may be evaluated by the number of control states divided by the number of functions. For complete logic networks, that is for logic networks which are capable of presenting all possible Boolean logic functions for the number of input variables, this ratio may be anywhere in the range of 1 to infinity. In the case of the complete network of FIG. 2 which has a total of 24 control lines, the number of control states is 2 to the power 24 and the number of functions for the three input variables is 256 or 2 to the 8th. Consequently, the redundancy ratio is 2 to the power 16 thereby indicating that the network of FIG. 2 is an extremely redundant configuration. Table II provides a sample listing of the number of possible implementations for 30 of the 256 Boolean functions possible in the network of FIG. 2. As seen in Table II, except for the two trivial cases of a fixed zero or one input irrespective of the input, the number of possible implementations for various truth table functions of the network of FIG. 2 extends into the region between 100,000 and 200,000 such implementations for many of the functions and reduces to a minimum of 2,496 implementations for the least implementable function. Those having skill in the art to which the present invention pertains will in fact perceive that the minimum possible number of implementation schemes for any function in the entire table of 256 Boolean logic functions for the network of FIG. 2 is 2,496.

TABLE II

THE REDUNDANCY OF THE 3-INPUT NETWORK

| FUNCTION # | TRUTH TABLE OF FUNCTION | NUMBER OF IMPLEMENTATIONS |
|---|---|---|
| 0: | 00000000 | 3261376 |
| 1: | 00000001 | 128192 |
| 2: | 00000010 | 128192 |
| 3: | 00000011 | 113600 |
| 4: | 00000100 | 128192 |
| 5: | 00000101 | 113600 |
| 6: | 00000110 | 19776 |
| 7: | 00000111 | 22720 |
| 8: | 00001000 | 128192 |
| 9: | 00001001 | 19776 |
| 10: | 00001010 | 113600 |
| 11: | 00001011 | 22720 |
| 12: | 00001100 | 113600 |
| 13: | 00001101 | 22720 |
| 14: | 00001110 | 22720 |
| 15: | 00001111 | 127168 |
| 16: | 00010000 | 128192 |
| 17: | 00010001 | 188608 |
| 18: | 00010010 | 22528 |
| 19: | 00010011 | 20608 |
| 20: | 00010100 | 22528 |
| 21: | 00010101 | 20608 |
| 22: | 00010110 | 2496 |
| 23: | 00010111 | 2624 |
| . | . | |
| . | . | |
| . | . | |
| 250: | 11111010 | 113600 |
| 251: | 11111011 | 128192 |
| 252: | 11111100 | 113600 |
| 253: | 11111101 | 128192 |
| 254: | 11111110 | 128192 |
| 255: | 11111111 | 3261376 |

Figure 7:
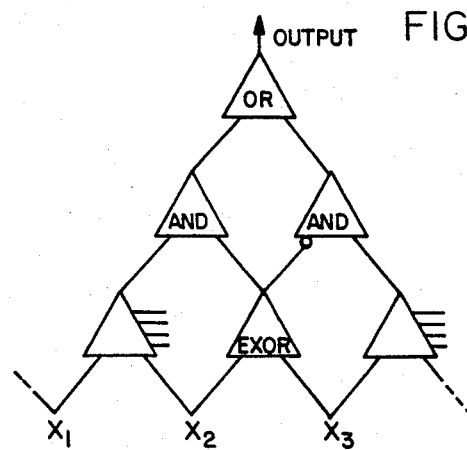
FIGS. 7 and 8 are alternative representations of a three input non-redundant structure of the present invention.
Figure 8:
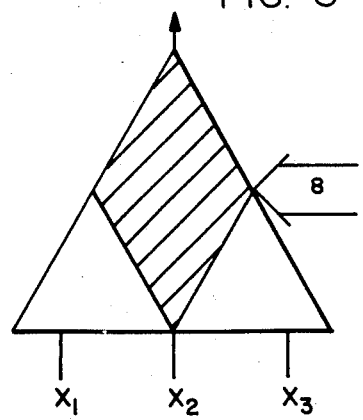

As previously indicated and as will be discussed hereinafter in more detail, redundancy renders the logic network fault tolerant making it more reliable and increasing production yields. However, such redundancy also provides an additional advantage which permits the designer to simplify the network while still retaining the quality of logic completeness. Simplification of logically redundant and complete networks which permit retention of the quality of completeness, may be accomplished in two ways. One way is to fix the logic configuration of some nodes or atoms within an array while retaining some measure of the control of the variation of the remaining nodes. The other way of simplification is to reduce the number of nodes in a particular array and thus reduce the number of control lines and control states. By way of example, FIGS. 7 and 8 both represent a simplified configuration of a three input structure of the present invention wherein redundancy has been reduced to one while the completeness quality of the network has been retained. As seen in FIG. 7, this is accomplished by fixing the uppermost atom of the array in an OR configuration and fixing the two atoms of the second level of the array in an AND and AND NOT configuration, respectively. It is to be noted for purposes of discussion herein that an AND NOT nomenclature refers to an AND gate having an inverter on one input. In some figures, an AND gate having an inverter (circle) on one leg is used as an alternative nomenclature. Finally, the middle node of the bottom level of the array has been fixed in an exclusive OR configuration and the remaining outside nodes of the bottom layer retain full control capability wherein four control lines and thus 2 to the power 4 control states can still be provided. It will be observed that the completeness of the network has been retained even though completeness of only two of the atoms has been preserved with the remaining atoms having their functional capability reduced to one chosen function. This simplified nonredundant but complete "diamond" configuration of the six atom array for three input variables of the present invention is illustrated in a form of schematic shorthand notation in FIG. 8 wherein the fixed atoms or nodes of the array are represented by the diamond shape cross hatched portion of the network and the total number of control lines is represented by the numeral containing arrow on the right side of the network.

Figure 9:
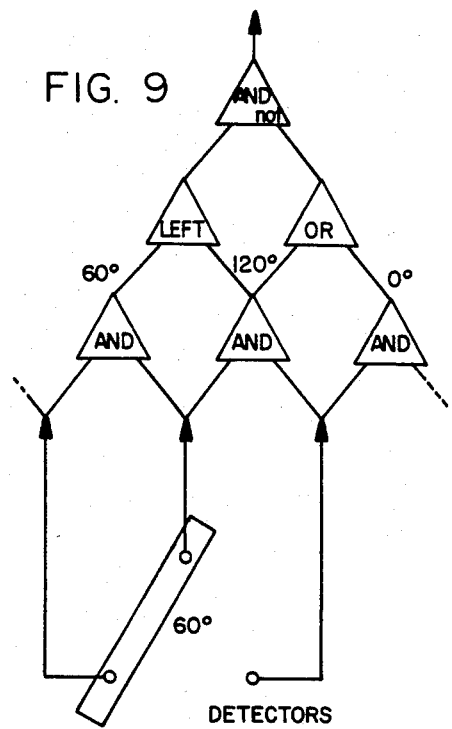
FIGS. 9-14 comprise logic network diagrams of the invention which illustrate the problem solving and fault tolerance capabilities of the invention.

Reference will now be made to FIGS. 9-14 which provide simple illustrative examples of the use of the redundancy of the present invention and the resultant advantages relating to fault tolerance. More specifically, referring first to FIG. 9 it will be seen that a three input network if the present invention is provided with a plurality of detectors a, b and c, one connected to each of the input variable lines to the network. For purposes of clarity, control line structure is now shown in FIG. 9 or in the remaining figures. However, it is to be understood that the control states of each of the atoms of the respective networks have already been selectively sequenced to achieve particular logic functions indicated in order to accomplish a given task. In the case of FIG. 9, the task is related to pattern recognition and more specifically, involves detection of a single line oriented at 60 degrees (between detectors a and b) as shown in the figure. The detectors a and b connected to the leftmost AND gate of the lower layer or tier of the array of FIG. 9 would generate a logical one while the remaining detector c would remain inactive and generate a logical zero. The task assigned also requires that the output of the network be a logical one only when the 60 degree line is present and that it be a logical zero when any other line is present whether or not a 60 degree line is present. In the logical nomenclature used in FIG. 9 the AND nodes and OR node operate in a conventional AND and OR gate configuration respectively. The node labeled LEFT is controlled to be transparent to the left input and to ignore the right input and the uppermost node labeled AND NOT is controlled to perform as a conventional AND gate but with an inverter on the right input. Those having skill in the digital logic art will recognize that a network having a particular combination of functional atoms shown in FIG. 9 will in fact perform the task of one line detection illustrated in that figure.

Figure 10:
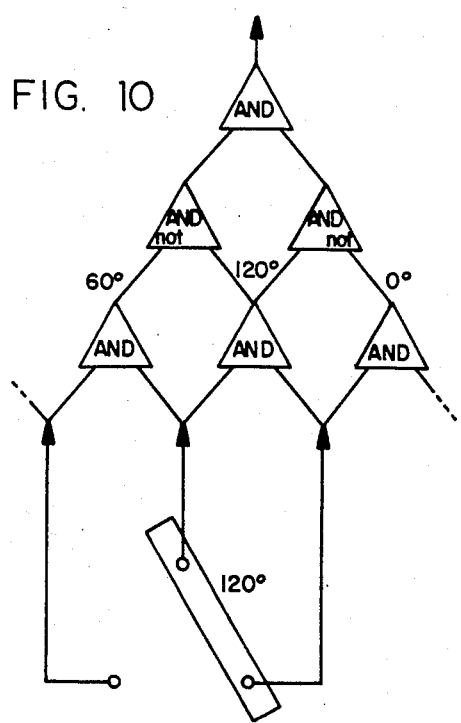

The task of the network shown in FIG. 10 is to detect the 120 degree line between detectors b and c illustrated in that figure and only that line. The absence of that line or the presence of additional lines should produce a zero logic output while the presence of the 120 degree line and only that line should produce a logical one output. As seen in FIG. 10 the network has been reprogrammed to accomplish this task. The lower layer of atoms remains the same, namely, three AND gates. However, the second layer of atoms has been altered so that the left atom has been changed to an AND gate with an inverter on its left leg and the right atom has been changed to an AND gate with an inverter on its right leg. In addition, the uppermost atom on the top layer of the network has been changed to an AND gate without inverters. Those having skill in the relevant art will recognize that the particular selection of atom function does indeed accomplish the task assigned to the network of FIG. 10.

Figure 11:
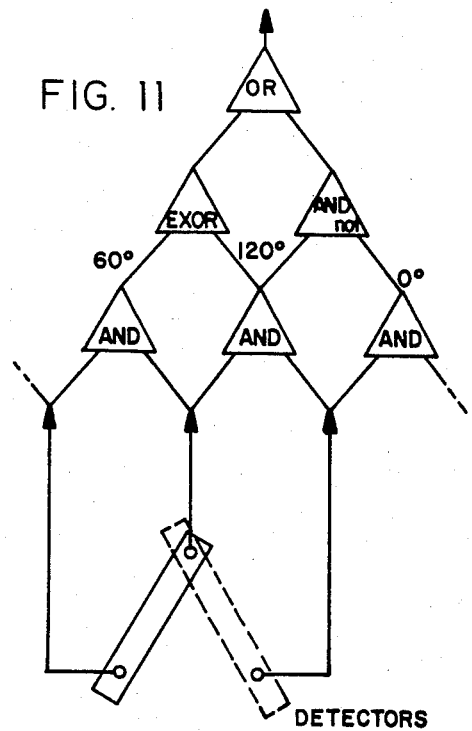
Figure 12:
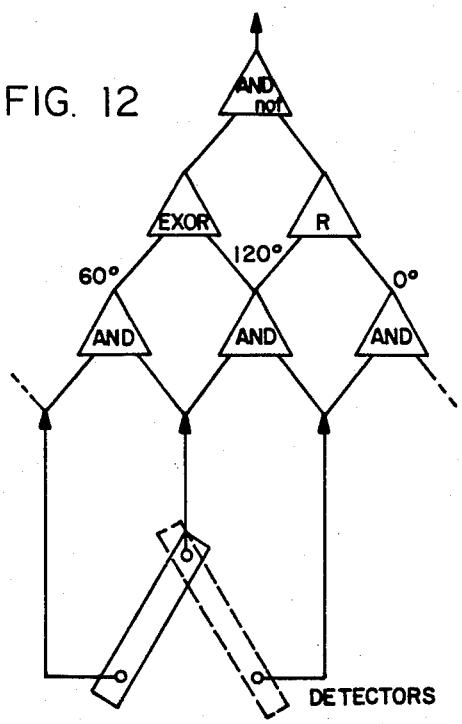
Figure 13:
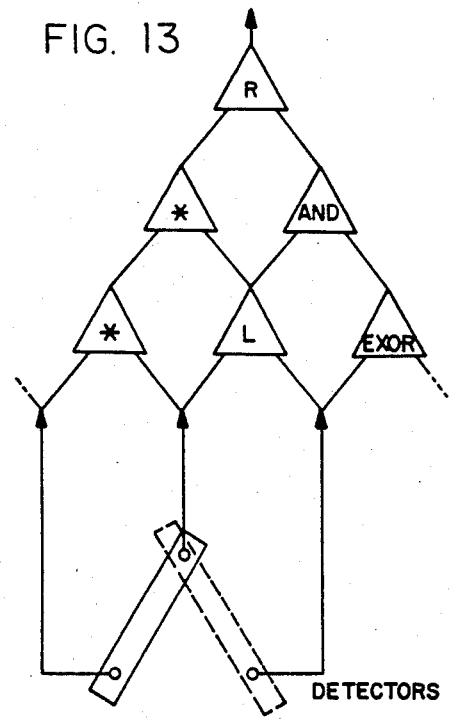
Figure 14:
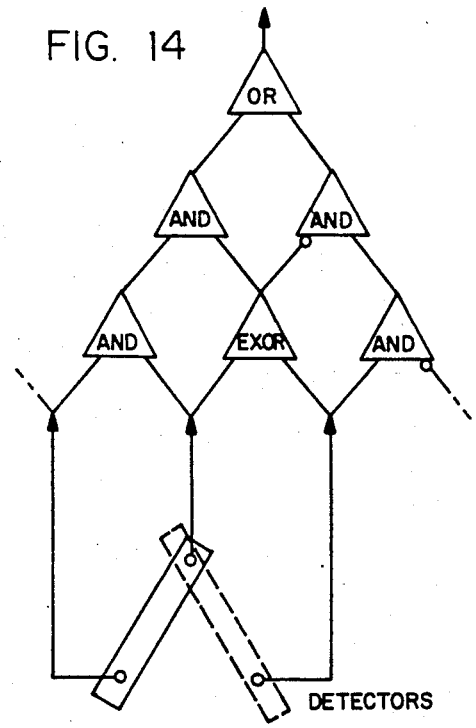

The task assigned to the networks of FIGS. 11-14 is that of detecting two lines, namely, the 60 degree line or the 120 degree line. The network should generate a logical one at its output only if either one of these lines is present and it should generate a zero at its logical output if both lines are present, if both lines are absent or if the third line, the zero degree line, is present. Those having skill in the relevant art will recognize that each of the networks of FIGS. 11-14 provides a different but acceptable solution to the task at hand and numerous other acceptable solutions will likely occur. This ability of the network of the present invention to provide multiple solutions to the same problem is a direct benefit of the feature of redundancy and illustrates an advantage of this feature. As previously indicated, one such benefit is fault tolerance. A non-redundant structure can provide only one solution to the problem and virtually any fault in any atom would render such non-redundant structures unsuitable for the problem presented. On the other hand, the redundant structure of the present invention provides a number of different solutions to the same problem. For example, as indicated in FIG. 13, that network utilizes an upper atom which is transparent to the right leg input, a right-most second tier atom which is an AND gate configuration, a right-most third tier atom which is an exclusive OR configuration, and a middle third tier atom which is in a transparent left leg configuration. The remaining two atoms, namely, the left-most atoms of tiers 2 and 3 are in a "don't care" configuration. Thus, if an attempt was first made to provide a solution, as indicated in FIGS. 11, 12 and 14 and it was determined that a fault existed in the left-most atoms of the second and third tiers, or in their interconnections, restructuring of the atom functions by simply varying the control states as needed to present the solution of FIG. 13 would permit use of the network despite the faults noted. Similarly, if the right second tier atom of the network were stuck in the right leg transparent position, the solution of the network shown in FIG. 12 would still provide means for implementing the task assigned to the network by simply revising the control states of the various atoms. Those having skill in the relevant art will no doubt perceive of various other faults which could be tolerated as a result of the multiple solutions shown in FIGS. 11-14 or the additional solutions that they have deduced as a result of the teaching herein.

The network configurations of FIGS. 11-14 are all solutions to one overall problem. However, the problem presented to each tier of atoms for each individual network solution may be quite unique depending upon the solution logic used to solve the overall problem. Tables III through VI illustrate this point on a tier-by-tier basis for each of the networks of FIGS. 11-14, respectively. Thus for example as seen in Table III, the top or number one tier of the network of FIG. 11 is presented with the problem of just recognizing one of two lines. The solution is an OR gate as represented by the solution $f_1 = f_2 + f_3$. The second or number two tier is presented with the problem of excluding the third line or a two line condition. The solution comprises an exclusive OR gate and an AND NOT gate as represented by the expressions $f_2 = f_4 \oplus f_5$; and $f_3 = f_5 \cdot f_6$. Finally, the third tier is presented with the problem of transforming points into lines. The solution for this problem comprises three AND gates as represented by the expressions $f_4 = a \cdot b$; $f_5 = b \cdot c$; and $f_6 = c \cdot a$, where a, b and c represent detector signals.

TABLE III (See FIG. 11)

| PROBLEM | SOLUTION |
|---|---|
| 1. Recognize one of two lines (60 degrees or 120 degrees). | $f_1 = f_2 + f_3$ |
| 2. Exclude third line or two lines. | $f_2 = f_4 \oplus f_5$ ; $f_3 = f_5 \cdot \bar{f_6}$ |
| 3. Transform points into lines. | $f_4 = a \cdot b$; $f_5 = b \cdot c$; $f_6 = c \cdot a$ |

TABLE IV (See FIG. 12)

| PROBLEM | SOLUTION |
|---|---|
| 1. Exclude third line. | $f_1 = f_2 \cdot \bar{f_3}$ |
| 2. Exclude two lines. | $f_2 = f_4 \oplus f_5$ ; $f_3 = f_6$ |
| 3. Transform points into lines. | $f_4 = a \cdot b$; $f_5 = b \cdot c$; $f_6 = c \cdot a$ |

TABLE V (See FIG. 13)

| PROBLEM | SOLUTION |
|---|---|
| 1. Copy solution. | $f_1 = f_3$ |
| 2. Recognize b and either a or c. | $f_3 = f_5 \cdot f_6$ |
| 3. Exclude two points a and c. | $f_5 = b$; $f_6 = c \oplus a$ |

TABLE VI (See FIG. 14)

| PROBLEM | SOLUTION |
|---|---|
| 1. | $f_1 = f_2 + f_3$ |
| 2. | $f_2 = f_4 \cdot f_5$ ; $f_3 = \bar{f_5} \cdot f_6$ |
| 3. | $f_4 = a \cdot b$; $f_5 = b \oplus c$; $f_6 = c \cdot a$ |

The series of tier problems and solutions of Table III and FIG. 11 comprises a perfectly logical approach that might be selected to solve the overall specific problem of line detection. However, Tables IV and V represent perfectly logical alternative solutions to the same specific problem of line detection. The logic of the tier problem breakdown process is immediately apparent to anyone and the tier solutions are apparent to anyone with knowledge of Boolean logic. Tables III, IV and V therefor, represent solution processes logical to humans. However, the redundancy of the network of the invention encompasses all possible solutions, even those that would not necessarily be contemplated by a human problem solver. Thus for example, there is no easy and eminently logical way of describing the individual tier problems of Table VI which corresponds to the network of FIG. 14. However, the tier solutions can be expressed as Boolean functions and the network does solve the problem presented. The solution of FIG. 14 is thus one much more likely to be produced by a non-human source such as a computer program. As will be seen hereinafter, a feature of the present invention consists of a computer program that can be used to select the appropriate control signals for any selected Boolean function.

A network capable of multiple solutions may be reprogrammed based on a variety of selected criteria utilizing a hierarchy of preferred configurations. A typical criterion might be propagation speed through the network of another might be, overcoming a known fault in the network. Still another criterion might be the optimization of the probability of tolerating a fault in the future without the need for varying control states by minimizing dependency on those atoms or network interconnections which statistically have the highest probability of producing a fault in the field. Irrespective of the criterion used to select a solution to a problem, the capability of programmably selecting any one of multiple solutions in order to provide a selected Boolean logic function to a plurality of input variables, is novel.

Figure 15A:
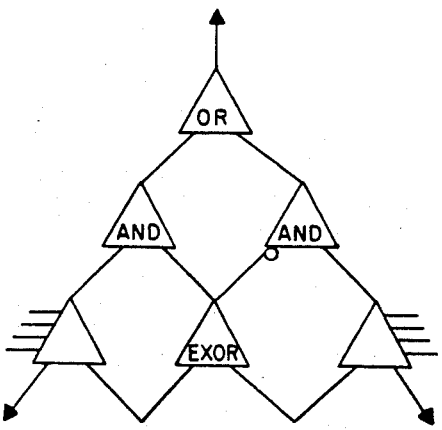
FIGS. 15a and 15b are alternative diamond network configurations of the invention for which control word-generating programs are disclosed.
Figure 16:
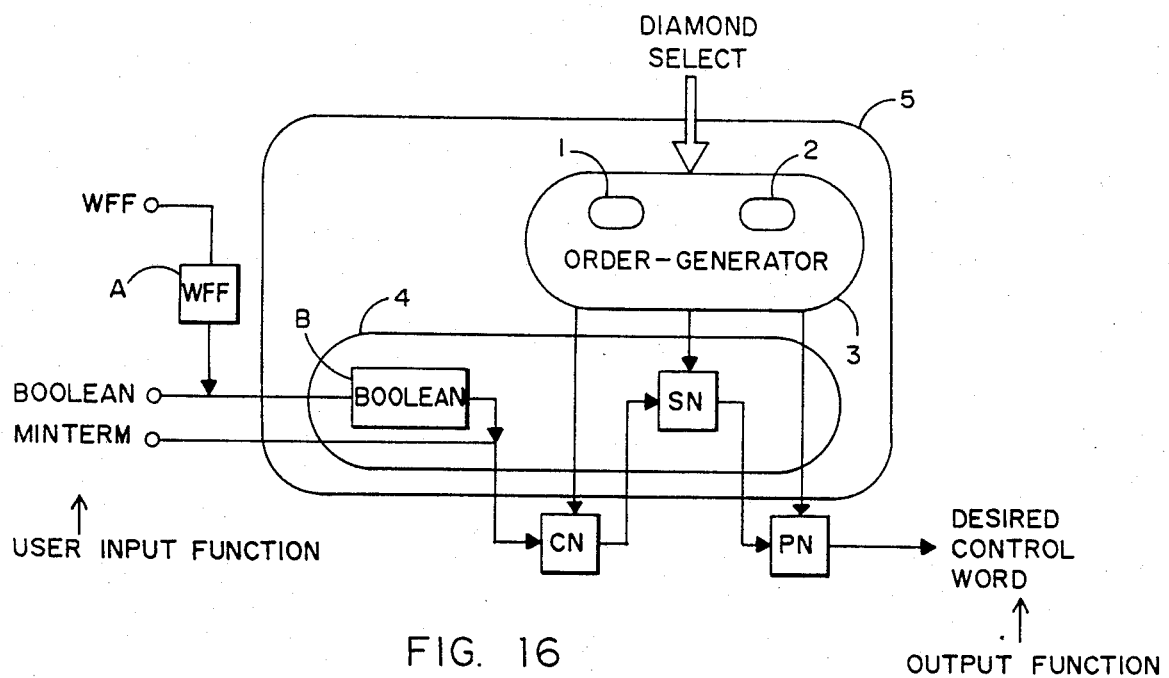
FIG. 16 is a schematic representation of the control word generating scheme of the present invention.

The use of the term "programmable" in conjunction with the network of the present invention, might suggest that in the future, implementation of logic architecture designs will be accomplished by programmers instead of chip designers. In point of fact, the ease of program implementation will enable the chip user to design his own architecture by simply specifying his desired logic function in any one of a number of alternative functional languages. FIG. 16, a control word generator flow chart, illustrates this feature. A user merely inputs his desired function in minterm expressions, Boolean expressions or Well-Formed Formulas. Each such "language" is interpreted by a set of basic definitions comprising a vocabulary or compilers A and B, and the specific expression is then processed by a program designed to convert the "language expression" into a network control word. For purposes of illustration, one such program is listed in Table VII herein. The example of Table VII is for use in generating the control word for the diamond structure of FIG. 15a. Of course, it will be understood that the program of Table VII could be easily expanded to first select the gate functions of the diamond atoms and control signals therefor before selecting the control word for the remaining left and right atoms of the bottom tier.

The program of Table VII is in the well-known LISP language which is described beginning at page 853 of Encyclopedia of Computer Science and Engineering (second edition), edited by Anthony Ralston, 1983, Van Nostrand Reinhold Company. Those having skill in the relevant arts will readily comprehend the program example of Table VII. However, for purposes of additional clarity, a trace of a specific programmed sequence is provided in Table VIII herein.

Figure 15B:
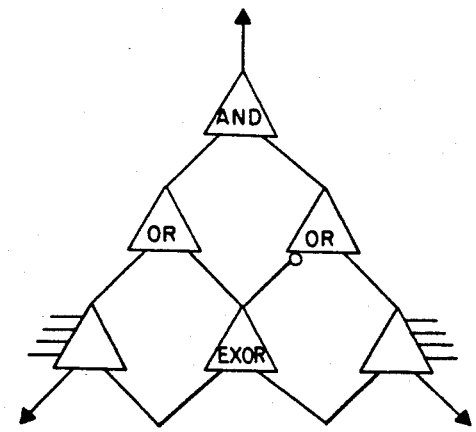

An additional LISP program example, for use in generating the control word for the diamond structure of FIG. 15b, is shown in Table IX. Referring once more to FIG. 16, compilers A and B operate in a canonical form, independent of the various network hardware alternatives. When a particular diamond structure is selected, that is, the Boolean functions of the fixed atoms are chosen, a transformation of central line sequence is then needed to impress the network with the desired logical function. The selection is carried out and accounted for in the selection portion of FIG. 16. This portion of the control word generator, determines whether the selected diamond network is one which includes additional combinatorial logic components or one which does not (see Table X). It also selects the number of data variable inputs (three in the cases of FIGS. 15a and 15b), and arranges the control word signal sequence to first convert from the canonical sequence to a truth table sequence such as represented by Table I, and then to a sequence dictated by the hardware configuration.

The entire LISP program sequences of Tables VII or IX may be represented by the enclosed portion of FIG. 16 called "control" and labelled 5. The program includes intermediate sets of operation which may be represented by the enclosed portions called "evaluate-all", "order-generator", "right module" and "left module" and labelled 4, 3, 2, and 1, respectively, where the portion 3 includes the functions 2 and 1, i.e., the number of data variable inputs and the specifics of the diamond network for which the control word is being generated. Of the three functions Shuffle Network, (SN), Combinatorial Network (CN) and Personality Network (PN) of FIG. 16, only the network function labelled SN is always part of the program. SN is the shuffle net statements which reorder the canonical ordering of the control word. Shuffle net statements are characteristic of all diamond network configurations. CN is a set of statements which would be included in the program if the diamond network selection were one which required some additional combinatorial logic device for implementation of the network. PN is a hardware design function dictated by the personality of the VLSI chip and a consequence of decisions by the original VLSI chip designer in accordance with the layout of the architecture.

Referring to Table VII, the LISP statements corresponding to the functions depicted in FIG. 16, are indicated by the corresponding numbers in the left margin and the Boolean definitions or basic logic functions used in this particular program, are indicated by the letter B also in the left margin.

TABLE VII

```
; select control word appropriate to left module of dia-
    mond structure
; [Xn=not(X1)].
① (defun left-module (string-list)
      (cond ((null string-list) nil)
            (t (cons (append (car string-list)
                              (list (NOT (car (car string-
                                              list)))))
                     (left-module (cdr string-list))
      ) )     ) )
; select control word appropriate to right module of
    diamond structure
; [X1=Xn].
② (defun right-module (string-list)
      (cond ((null string-list) nil
            (t (cons (cons (car (reverse (car string-
                                          list)))
                           (car string-list)
                     (right-module (cdr string-list))
      ) )     ) )
; generate the ordering of the truth table appropriate
    to the hardware
③ (defun order-generator (string-list n)
      (cond ((equal n 0) string-list)
            (t (order-generator (append (left-module string-
                                         list)
                                        (right-module
                                         string-list))
                                (difference n 1)))
      ) )
; evaluate user function to produce control word
; recursive operation generates all the necessary control
    bits
④ (defun evaluate-all (argument-list function-name)
      (cond ((null argument-list) nil)
            (t (cons (function-name (car argument-list))
                     (evaluate-all (cdr argument-list)
                                    function-name)
      ) )     ) )
; control word generator
```

TABLE VII-continued

⑤
```
(defun control (function-name n)
    (cond ((lessp n 2) nil)
          (t (evaluate-all (order-generator '((0 0) (0 1)
                                              0) (1 1))
                                                    (difference n
                                                                2))
                           function-name)
    ) )   )
; some primitive boolean functions
(defun NOT (×) (difference 1 ×))
(defun AND (×1 ×2)
    (cond ((and (equal ×1 1) (equal ×2 1)) 1)
          (t 0)))
(defun OR (×1 ×2)
    (cond ((or (equal ×1 1) (equal ×2 1)) 1)
          (t 0)))
(defun EXOR (×1 ×2)
    (cond ((not (equal ×1 ×2)) 1)
          (t 0)))
(defun IMPLY (×1 ×2)
    (OR (NOT ×1) ×2))
```
Ⓑ applies to the primitive boolean functions block.

TABLE VIII

```
Franz Lisp, Opus 38.50
→ (load 'program1)
[load program1.1]
t
→ (defun g1 (arg-list)
      (AND (car arg-list)
           (OR (cadr arg-list)
               (caddr arg-list)
      ) ) )
t
→ (control 'g1 3)
1 <Enter> control (g1 3)
 1 <Enter> order-generator (((0 0) (0 1) (1 0) (1 1)) 1
  1 <Enter> left-module (((0 0) (0 1) (1 0) (1 1)))
   1 <Enter> NOT (0)
   1 <EXIT> NOT 1
   2 <Enter> left-module (((0 1) (1 0) (1 1)))
    1 <Enter> NOT (0)
    1 <EXIT> NOT 1
    3 <Enter> left-module (((1 0) (1 1)))
     1 <Enter> NOT (1)
     1 <EXIT> NOT 0
     4 <Enter> left-module (((1 1)))
      1 <Enter> NOT (1)
      1 <EXIT> NOT 0
      5 <Enter> left-module (nil)
      5 <EXIT> left-module nil
     4 <EXIT> left-module ((1 1 0))
    3 <EXIT> left-module ((1 0 0) (1 1 0))
   2 <EXIT> left-module ((0 1 1)(1 0 0) (1 1 0))
  1 <EXIT> left-module ((0 0 1) (0 1 1) (1 0 0) (1 1 0))
  1 <Enter> right module (((0 0) (0 1) (1 0) (1 1))
   2 <Enter> right module (((0 1) (1 0) (1 1)))
    3 <Enter> right-module (((1 0) (1 1)))
     4 <Enter> right-module (((1 1)))
      5 <Enter> right-module (nil)
      5 <EXIT> right-module nil
     4 <EXIT> right-module ((1 1 1))
    3 <EXIT> right-module ((0 1 0) (1 1 1))
   2 <EXIT> right-module ((1 0 1) (0 1 0) (1 1 1))
  1 <EXIT> right-module ((0 0 0) (1 0 1) (0 1 0) (1 1 1))
  2 <Enter> order-generator (((0 0 1) (0 1 1) (1 0 0) (1 1 0)
                              (0 0 0)...) 0)
  2 <EXIT> order-generator ((0 0 1) (0 1 1) (1 0 0) (1 1 0)
                             (0 0 0)...)
 1 <EXIT> order-generator ((0 0 1) (0 1 1) (1 0 0) (1 1 0)
                            (0 0 0)...)
 1 <Enter> evaluate-all (((0 0 1) (0 1 1) (1 0 0) (1 1 0) (0 0 0)
                          ...) g1)
  1 <Enter> OR (0 1)
  1 <EXIT> OR 1
  1 <Enter> AND (0 1)
  1 <EXIT> AND 0
  2 <Enter> evaluate-all (((0 1 1) (1 0 0) (1 1 0) (0 0 0)
                           (1 0 1)...) g1)
   1 <Enter> OR (1 1)
   1 <EXIT> OR 1
```

TABLE VIII-continued

```
   1 <Enter> AND (0 1)
   1 <EXIT> AND 0
   3 <Enter> evaluate-all (((1 0 0) (1 1 0) (0 0 0) (1 0 1)
                            (0 1 0)...) g1)
    1 <Enter> OR (0 0)
    1 <EXIT> OR 0
    1 <Enter> AND (1 0)
    1 <EXIT> AND 0
    4 <Enter> evaluate-all (((1 1 0) (0 0 0) (1 0 1) (0 1 0)
                             (1 1 1)) g1)
     1 <Enter> OR (1 0)
     1 <EXIT> OR 1
     1 <Enter> AND (1 1)
     1 <EXIT> AND 1
     5 <Enter> evaluate-all (((0 0 0) (1 0 1) (0 1 0) (1 1 1)) g1)
      1 <Enter> OR (0 0)
      1 <EXIT> OR 0
      1 <Enter> AND (0 0)
      1 <EXIT> AND 0
      6 <Enter> evaluate-all (((1 0 1) (0 1 0) (1 1 1)) g1)
       1 <Enter> OR (0 1)
       1 <EXIT> OR 1
       1 <Enter> AND (1 1)
       1 <EXIT> AND 1
       7 <Enter> evaluate-all (((0 1 0) (1 1 1)) g1)
        1 <Enter> OR (1 0)
        1 <EXIT> OR 1
        1 <Enter> AND (0 1)
        1 <EXIT> AND 0
        8 <Enter> evaluate-all (((1 1 1)) g1)
         1 <Enter> OR (1 1)
         1 <EXIT> OR 1
         1 <Enter> AND (1 1)
         1 <EXIT> AND 1
         9 <Enter> evaluate-all (nil g1)
         9 <EXIT> evaluate-all nil
        8 <EXIT> evaluate-all (1)
       7 <EXIT> evaluate-all (0 1)
      6 <EXIT> evaluate-all (1 0 1)
     5 <EXIT> evaluate-all (0 1 0 1)
    4 <EXIT> evaluate-all (1 0 1 0 1)
   3 <EXIT> evaluate-all (0 1 0 1 0...)
  2 <EXIT> evaluate-all (0 0 1 0 1...)
 1 <EXIT> evaluate-all (0 0 0 1 0...)
1 <EXIT> control (0 0 0 1 0...)
(0 0 0 1 0 1 0 1)
→ (exit)
```

TABLE IX

```
; select control word appropriate to left module of diamond
  structure
; [×n = ×1].
① (defun a-module (string-list)
      (cond ((null string-list) nil)
            (t (cons (append (car string-list)
                              (list (car (car string-list))))
                     (left-module (cdr string-list))
      ) )   ) )
; select control word appropriate to right module of dia-
  mond structure
; [×1 = NOT(×n)]
② (defun right-module (string-list)
      (cond ((null string-list) nil)
            (t (cons (cons (NOT (car (reverse (car string-list))))
                           (car string-list))
                     (right-module (cdr sting-list))
      ) )   ) )
; generate the ordering of the truth table appropriate to the
  hardware
③ (defun order-generator (string-list n)
      (cond ((equal n 0) string-list)
            (t (order-generator (append (left-module string-list)
                                         (right-module string-
                                                        list)
                                (difference n 1)))
      ) )
; evaluate user function to produce control word
; recursive operation generates all the necessary control bits
④ (defun evaluate-all (argument-list function-name)
      (cond ((null argument-list) nil)
```

TABLE IX-continued

```
            (t (cons (function-name (car argument-list))
                    (evaluate-all (cdr argument-list) function-
                                   name)
     ) )       ) )
; control word generator
(defun control (function-name n)
    (cond ((lessp n 2) nil)
          (t (evaluate-all (order-generator '((0 0) (0 1)
                                              (1 0) (1 1))
                                                              (difference n 2))
                                            function-name)
     ) ))     )
; some primitive boolean functions
(defun NOT (X) (difference 1 X))
(defun AND (X1 X2)
    (cond ((and (equal X1 1) (equal X2 1)) 1)
          (t 0)))
(defun OR (X1 X2)
    (cond ((or (equal X1 1) (equal X2 1)) 1)
          (t 0)))
(defun EXOR (X1 X2)
    (cond ((not (equal X1 X2)) 1)
          (t 0)))
(defun IMPLY (X1 X2)
    (OR (NOT X1) X2))
```

A test procedure that can detect faults in the inventive network is described in copending patent application Ser. No. 553,571 filed on Nov. 21, 1983. Such a test procedure may be implemented by a simple test apparatus 110 shown in FIG. 17 and comprising a microprocessor controller and a graphic display. The test apparatus is configured as a parallel I/O port interfacing with a Z80 based microprocessor 112. The microprocessor stores the test program, manipulates the data set for the three-variable input gate structure under test and collects and stores resultant bit patterns from the gate structure's Z output. The microprocessor also manages a monitor display 114. Other types of monitors can, of course, be used.

Figure 17:
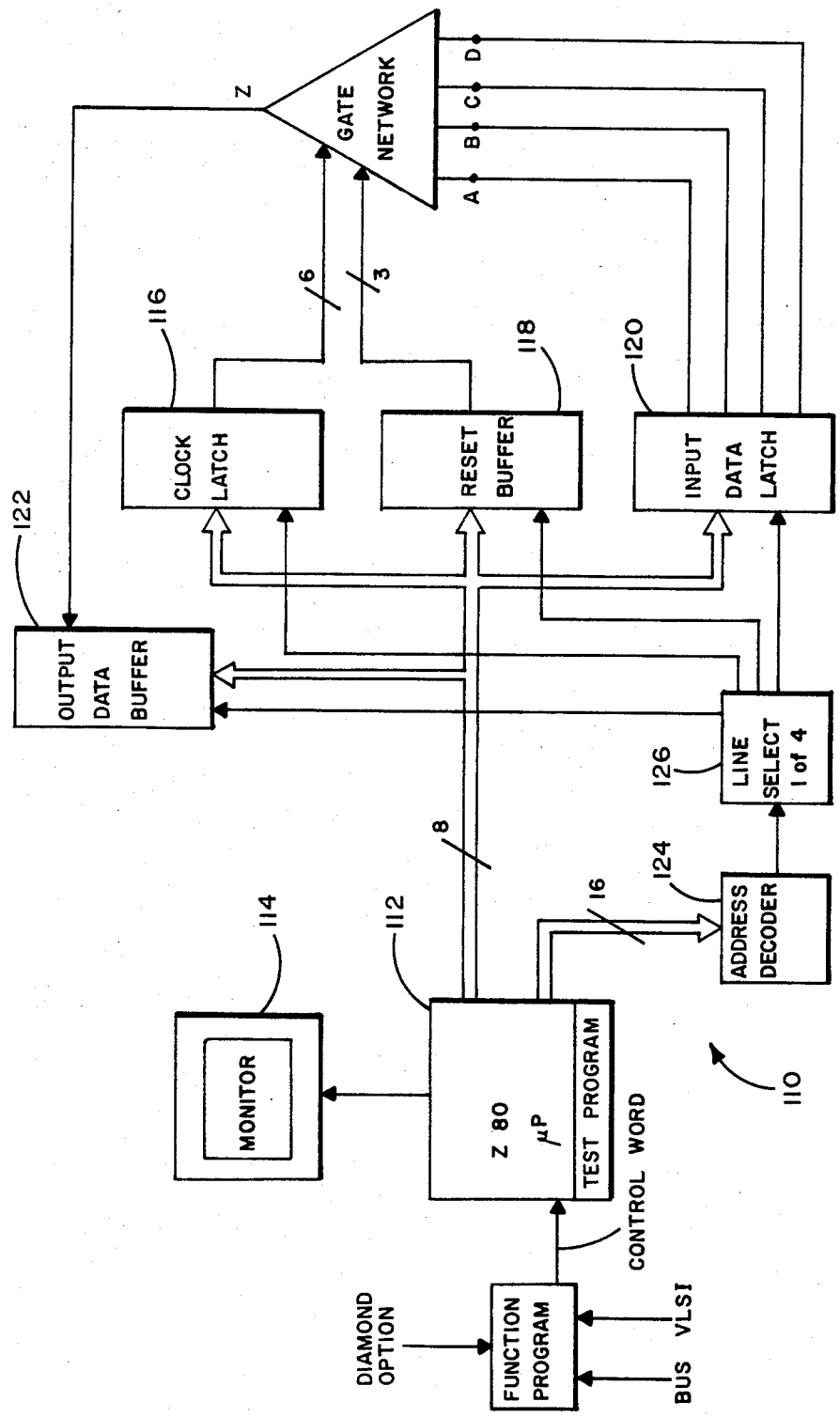
FIG. 17 is a block diagram representation of apparatus which may be used during production testing and programming of the present invention.

In a particular embodiment of the test apparatus shown in FIG. 17 a Z80 microprocessor based computer was used for this task. The basic language interpreter and the graphics characters that are stored in the ROM of the computer were utilized in a test program. The tester is parallel connected to the Z80 data bus to form input commands and to add words to the bus from the logic gate output. The data bus is interfaced by six latches and three tri-state buffers. These devices are strobed by a memory-map address decoder circuit. A six-bit word is latched as a set of clocks by clock latch 116. One bit is assigned to each of the six nodes in the device under test. The most significant bit forms the clock for the highest level, number one mode and the least significant bit forms the clock for one of the lowest level nodes. Because the particular embodiment of the integrated circuit chip hosts two complete three-variable input gate structures and each gate structure is to be clocked with its own word, two six-bit latches are required. The three-bit word is acquired from the data bus by a reset buffer 118 to form a set of CLEAR commands. The individual clear connections to each node are connected together to form a layer of clearing capability. This reduction of the number of CLEAR signals required from the tester was made in order to reduce the hardware complexity. With three-bit clear words, both halves of the chip can be accommodated in one clear or reset command of six bits. A four-bit word is latched by input data latch 120 for the input data to each three-variable input gate structure. The resultant eight-bit word is accommodated by a single command from the Z80 microprocessor.

Data is read from the circuit under test by an output buffer 122 upon command from the microprocessor 112. The least significant bit read is the state of one Z output of one of the two three-variable input logic structures and the next bit is the state of the other three-variable input gate logic structure. Both outputs are read in the resultant two-bit word. This provision permits detection of possible anomalous operations from the gate structure that is not under test but that shares the same device chip.

Strobe commands to the latches and buffers are produced by the memory-mapped address decoder 124 and a line selector 126. The one-of-four line selector circuit 126 produces four write strobe commands and four read strobe commands. The write strobes are: CLOCK for each three-variable input gate structure, CLEAR and ENTER DATA WORD. Only a read strobe is necessary to determine the output states of the two gate structures. A Basic program that follows the test procedure outlined above is indicated in the aforementioned copending patent application Ser. No. 553,571.

The test procedure involves configuring a node with specific inputs and then cycling the node through its sixteen logical states. Since each node has the same response to a given input state, the output data collected from each node can be organized into sets defined by the input states. The program produces a graphic display of each set of Z responses in a pattern that reveals the actual bit code. Anomalous responses are detected by presenting the observer with a regular pattern for correct data. The human skill for detecting pattern irregularities may be exploited to expose subtle fault conditions. Of course, pattern recognition devices or programmed digital detection schemes can be substituted for a human observer.

The amenability of the network of the invention to testing and its fault-tolerant redundancy feature, can be readily combined to achieve a highly advantageous gain in the level of productivity. More specifically, by integrating the function control program of Table VII (or similar programs) and well-known digital sequence detection schemes into the programming of the computer of FIG. 17, one can accomplish a great deal more than merely detect faults. One can also reprogram the atom functions of a faulty network while continuing to assess its performance until either a suitable fault-tolerant configuration is achieved or all networks for a given Boolean function have been selected and tested. Of course, in many instances the fault may be too critical to permit any configuration to perform as required. However, the probability of significantly increasing production yields will be greatly enhanced by numerous instances in which an alternative network configuration will provide the desired gate characteristics despite the presence of a fault. This unique capability and the aforementioned novel means for implementing it are contemplated as being within the scope of the present invention and are represented by the function program software and suitable selection inputs at the left-most portion of FIG. 17.

Figure 18:
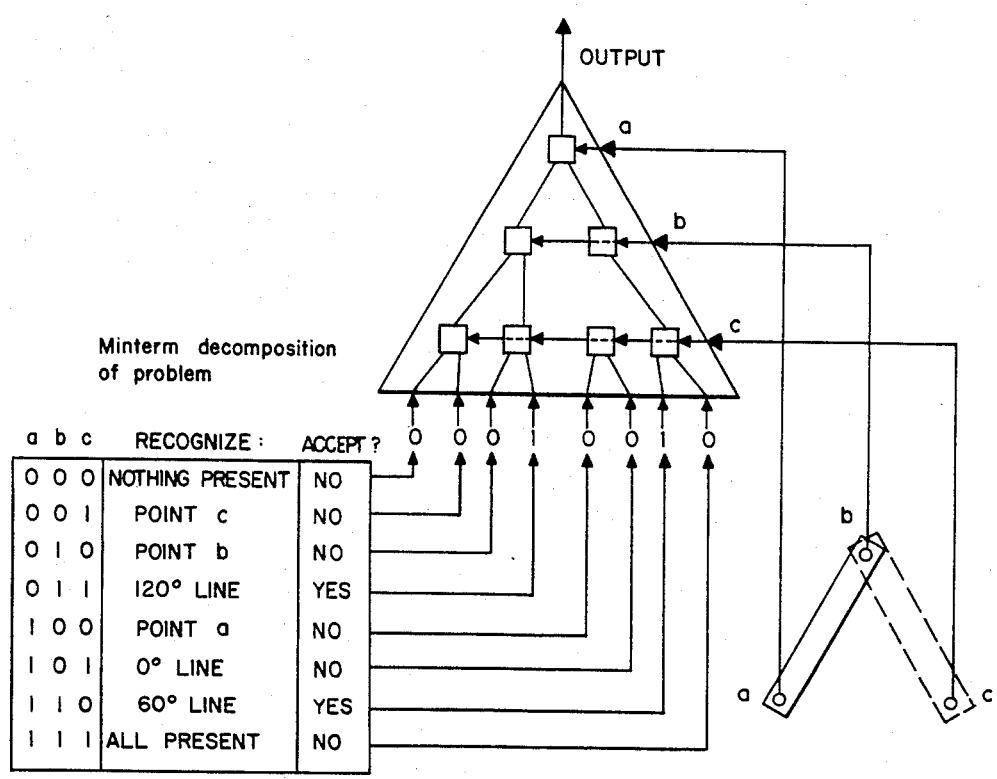
FIG. 18 is a block diagram illustrating the method of programming the only available solution of a problem example utilizing a prior art network.

A Yau multiplexer tree of the prior art is shown in FIG. 18 for purposes of contrasting this non-redundant structure with the present invention and to point out the difference in the use of the term "programmable" as applied herein and as used in conjunction with the prior art. The Yau tree consists of an array of multiplexers. In the example of FIG. 18 each such multiplexer has two input lines and one output line. The data input signals (a, b, c) determine which one of two possible control signals is applied to the output. This prior art device is not redundant and therefore can provide only one configuration solution for a desired logic function.

For purposes of illustration, the prior art multiplexer tree is shown in FIG. 18 as being used for detection of two lines by detectors a, b and c, comparable to the function served by the inventive networks of FIGS. 11–14. As further shown in FIG. 18, the logic state of the control signals applied to the multiplexer tree can be determined by a minterm decomposition of the particular problem presented by specifying the output signal for every possible combination of detector conditions. One may consider this to be a form of programming. However, it is not "programming" in the same sense as used herein for the invention because it is merely the brute force association of the output signal for every possible multiplexer interconnection combination. It is not a tier by tier logical programming approach as described above in conjunction with Tables III through VI. More importantly however, the solution to the problem presented to the prior art multiplexer tree of FIG. 18 is the only possible solution for that network and the given function. It is not fault tolerant and cannot be programmed to provide alternative solutions to overcome faults or for any other reason. There are no alternative solutions!

On the other hand, there are 1,024 diamond networks which are complete. These networks are listed below in Table X in a hexadecimal format and were determined by an exhaustive examination of all possible diamond network configurations. Each entry in Table X comprises four hexadecimal numbers. Each such number is keyed to the truth table of Table I as indicated in the right-most column of that Table. Reading from left to right, the four hexadecimal numbers of each entry of Table X correspond to the function of the top node, left node of the second tier, right node of the second tier, and center node of the bottom tier, respectively. Because each corresponding network is complete, each entry represents an alternative implementation to any problem requiring a Boolean function for three input data variables. In effect, each entry in Table X fixes four nodes of the network of FIG. 2 resulting in alternative symbolic representations of FIG. 8 (the diamond network). It is to be noted that the prior art implementation configuration of FIG. 18 is the only for function No. 18 of Table II of which the Yau mux tree is capable. As noted in Table II, the present invention can provide 22,528 implementations of function No. 18 of which FIGS. 11, 12, 13 and 14 represent only four.

TABLE X

| | | | |
|---|---|---|---|
| 1:7:D:6 | 1:7:D:9 | 1:7:E:6 | 1:7:E:9 |
| 1:B:7:6 | 1:B:7:9 | 1:B:B:6 | 1:B:B:9 |
| 1:D:D:6 | 1:D:D:9 | 1:D:E:6 | 1:D:E:9 |
| 1:E:7:6 | 1:E:7:9 | 1:E:B:6 | 1:E:B:9 |
| 2:7:1:6 | 2:7:1:9 | 2:7:2:6 | 2:7:2:9 |
| 2:B:4:6 | 2:B:4:9 | 2:B:8:6 | 2:B:8:9 |
| 2:D:1:6 | 2:D:1:9 | 2:D:2:6 | 2:D:2:9 |
| 2:E:4:6 | 2:E:4:9 | 2:E:8:6 | 2:E:8:9 |
| 4:1:7:6 | 4:1:7:9 | 4:1:B:6 | 4:1:B:9 |
| 4:2:D:6 | 4:2:D:9 | 4:2:E:6 | 4:2:E:9 |
| 4:4:7:6 | 4:4:7:9 | 4:4:B:6 | 4:4:B:9 |
| 4:8:D:6 | 4:8:D:9 | 4:8:E:6 | 4:8:E:9 |
| 6:1:4:6 | 6:1:4:9 | 6:1:5:6 | 6:1:5:7 |
| 6:1:5:9 | 6:1:5:B | 6:1:5:D | 6:1:5:E |
| 6:1:6:6 | 6:1:6:7 | 6:1:6:9 | 6:1:6:B |
| 6:1:6:D | 6:1:6:E | 6:1:7:6 | 6:1:7:9 |

TABLE X-continued

| | | | |
|---|---|---|---|
| 6:1:8:6 | 6:1:8:9 | 6:1:9:6 | 6:1:9:7 |
| 6:1:9:9 | 6:1:9:B | 6:1:9:D | 6:1:9:E |
| 6:1:A:6 | 6:1:A:7 | 6:1:A:9 | 6:1:A:B |
| 6:1:A:D | 6:1:A:E | 6:1:B:6 | 6:1:B:9 |
| 6:2:1:6 | 6:2:1:9 | 6:2:2:6 | 6:2:2:9 |
| 6:2:5:1 | 6:2:5:2 | 6:2:5:4 | 6:2:5:6 |
| 6:2:5:8 | 6:2:5:9 | 6:2:6:1 | 6:2:6:2 |
| 6:2:6:4 | 6:2:6:6 | 6:2:6:8 | 6:2:6:9 |
| 6:2:9:1 | 6:2:9:2 | 6:2:9:4 | 6:2:9:6 |
| 6:2:9:8 | 6:2:9:9 | 6:2:A:1 | 6:2:A:2 |
| 6:2:A:4 | 6:2:A:6 | 6:2:A:8 | 6:2:A:9 |
| 6:2:D:6 | 6:2:D:9 | 6:2:E:6 | 6:2:E:9 |
| 6:3:1:6 | 6:3:1:7 | 6:3:1:9 | 6:3:1:B |
| 6:3:1:D | 6:3:1:E | 6:3:2:6 | 6:3:2:7 |
| 6:3:2:9 | 6:3:2:B | 6:3:2:D | 6:3:2:E |
| 6:3:4:1 | 6:3:4:2 | 6:3:4:4 | 6:3:4:6 |
| 6:3:4:8 | 6:3:4:9 | 6:3:7:1 | 6:3:7:2 |
| 6:3:7:4 | 6:3:7:6 | 6:3:7:8 | 6:3:7:9 |
| 6:3:8:1 | 6:3:8:2 | 6:3:8:4 | 6:3:8:6 |
| 6:3:8:8 | 6:3:8:9 | 6:3:B:1 | 6:3:B:2 |
| 6:3:B:4 | 6:3:B:6 | 6:3:B:8 | 6:3:B:9 |
| 6:3:D:6 | 6:3:D:7 | 6:3:D:9 | 6:3:D:B |
| 6:3:D:D | 6:3:D:E | 6:3:E:6 | 6:3:E:7 |
| 6:3:E:9 | 6:3:E:B | 6:3:E:D | 6:3:E:E |
| 6:4:4:6 | 6:4:4:9 | 6:4:5:6 | 6:4:5:7 |
| 6:4:5:9 | 6:4:5:B | 6:4:5:D | 6:4:5:E |
| 6:4:6:6 | 6:4:6:7 | 6:4:6:9 | 6:4:6:B |
| 6:4:6:D | 6:4:6:E | 6:4:7:6 | 6:4:7:9 |
| 6:4:8:6 | 6:4:8:9 | 6:4:9:6 | 6:4:9:7 |
| 6:4:9:9 | 6:4:9:B | 6:4:9:D | 6:4:9:E |
| 6:4:A:6 | 6:4:A:7 | 6:4:A:9 | 6:4:A:B |
| 6:4:A:D | 6:4:A:E | 6:4:B:6 | 6:4:B:9 |
| 6:6:1:6 | 6:6:1:7 | 6:6:1:9 | 6:6:1:B |
| 6:6:1:D | 6:6:1:E | 6:6:2:6 | 6:6:2:7 |
| 6:6:2:9 | 6:6:2:B | 6:6:2:D | 6:6:2:E |
| 6:6:4:1 | 6:6:4:2 | 6:6:4:4 | 6:6:4:6 |
| 6:6:4:8 | 6:6:4:9 | 6:6:7:1 | 6:6:7:2 |
| 6:6:7:4 | 6:6:7:6 | 6:6:7:8 | 6:6:7:9 |
| 6:6:8:1 | 6:6:8:2 | 6:6:8:4 | 6:6:8:6 |
| 6:6:8:8 | 6:6:8:9 | 6:6:B:1 | 6:6:B:2 |
| 6:6:B:4 | 6:6:B:6 | 6:6:B:8 | 6:6:B:9 |
| 6:6:D:6 | 6:6:D:7 | 6:6:D:9 | 6:6:D:B |
| 6:6:D:D | 6:6:D:E | 6:6:E:6 | 6:6:E:7 |
| 6:6:E:9 | 6:6:E:B | 6:6:E:D | 6:6:E:E |
| 6:7:1:6 | 6:7:1:9 | 6:7:2:6 | 6:7:2:9 |
| 6:7:5:1 | 6:7:5:2 | 6:7:5:4 | 6:7:5:6 |
| 6:7:5:8 | 6:7:5:9 | 6:7:6:1 | 6:7:6:2 |
| 6:7:6:4 | 6:7:6:6 | 6:7:6:8 | 6:7:6:9 |
| 6:7:9:1 | 6:7:9:2 | 6:7:9:4 | 6:7:9:6 |
| 6:7:9:8 | 6:7:9:9 | 6:7:A:1 | 6:7:A:2 |
| 6:7:A:4 | 6:7:A:6 | 6:7:A:8 | 6:7:A:9 |
| 6:7:D:6 | 6:7:D:9 | 6:7:E:6 | 6:7:E:9 |
| 6:8:1:6 | 6:8:1:9 | 6:8:2:6 | 6:8:2:9 |
| 6:8:5:1 | 6:8:5:2 | 6:8:5:4 | 6:8:5:6 |
| 6:8:5:8 | 6:8:5:9 | 6:8:6:1 | 6:8:6:2 |
| 6:8:6:4 | 6:8:6:6 | 6:8:6:8 | 6:8:6:9 |
| 6:8:9:1 | 6:8:9:2 | 6:8:9:4 | 6:8:9:6 |
| 6:8:9:8 | 6:8:9:9 | 6:8:A:1 | 6:8:A:2 |
| 6:8:A:4 | 6:8:A:6 | 6:8:A:8 | 6:8:A:9 |
| 6:8:D:6 | 6:8:D:9 | 6:8:E:6 | 6:8:E:9 |
| 6:9:1:6 | 6:9:1:7 | 6:9:1:9 | 6:9:1:B |
| 6:9:1:D | 6:9:1:E | 6:9:2:6 | 6:9:2:7 |
| 6:9:2:9 | 6:9:2:B | 6:9:2:D | 6:9:2:E |
| 6:9:4:1 | 6:9:4:2 | 6:9:4:4 | 6:9:4:6 |
| 6:9:4:8 | 6:9:4:9 | 6:9:7:1 | 6:9:7:2 |
| 6:9:7:4 | 6:9:7:6 | 6:9:7:8 | 6:9:7:9 |
| 6:9:8:1 | 6:9:8:2 | 6:9:8:4 | 6:9:8:6 |
| 6:9:8:8 | 6:9:8:9 | 6:9:B:1 | 6:9:B:2 |
| 6:9:B:4 | 6:9:B:6 | 6:9:B:8 | 6:9:B:9 |
| 6:9:D:6 | 6:9:D:7 | 6:9:D:9 | 6:9:D:B |
| 6:9:D:D | 6:9:D:E | 6:9:E:6 | 6:9:E:7 |
| 6:9:E:9 | 6:9:E:B | 6:9:E:D | 6:9:E:E |
| 6:B:4:6 | 6:B:4:9 | 6:B:5:6 | 6:B:5:7 |
| 6:B:5:9 | 6:B:5:B | 6:B:5:D | 6:B:5:E |
| 6:B:6:6 | 6:B:6:7 | 6:B:6:9 | 6:B:6:B |
| 6:B:6:D | 6:B:6:E | 6:B:7:6 | 6:B:7:9 |
| 6:B:8:6 | 6:B:8:9 | 6:B:9:6 | 6:B:9:7 |
| 6:B:9:9 | 6:B:9:B | 6:B:9:D | 6:B:9:E |
| 6:B:A:6 | 6:B:A:7 | 6:B:A:9 | 6:B:A:B |
| 6:B:A:D | 6:B:A:E | 6:B:B:6 | 6:B:B:9 |
| 6:C:1:6 | 6:C:1:7 | 6:C:1:9 | 6:C:1:B |
| 6:C:1:D | 6:C:1:E | 6:C:2:6 | 6:C:2:7 |

TABLE X-continued

| | | | |
|---|---|---|---|
| 6:C:2:9 | 6:C:2:B | 6:C:2:D | 6:C:2:E |
| 6:C:4:1 | 6:C:4:2 | 6:C:4:4 | 6:C:4:6 |
| 6:C:4:8 | 6:C:4:9 | 6:C:7:1 | 6:C:7:2 |
| 6:C:7:4 | 6:C:7:6 | 6:C:7:8 | 6:C:7:9 |
| 6:C:8:1 | 6:C:8:2 | 6:C:8:4 | 6:C:8:6 |
| 6:C:8:8 | 6:C:8:9 | 6:C:B:1 | 6:C:B:2 |
| 6:C:B:4 | 6:C:B:6 | 6:C:B:8 | 6:C:B:9 |
| 6:C:D:6 | 6:C:D:7 | 6:C:D:9 | 6:C:D:B |
| 6:C:D:D | 6:C:D:E | 6:C:E:6 | 6:C:E:7 |
| 6:C:E:9 | 6:C:E:B | 6:C:E:D | 6:C:E:E |
| 6:D:1:6 | 6:D:1:9 | 6:D:2:6 | 6:D:2:9 |
| 6:D:5:1 | 6:D:5:2 | 6:D:5:4 | 6:D:5:6 |
| 6:D:5:8 | 6:D:5:9 | 6:D:6:1 | 6:D:6:2 |
| 6:D:6:4 | 6:D:6:6 | 6:D:6:8 | 6:D:6:9 |
| 6:D:9:1 | 6:D:9:2 | 6:D:9:4 | 6:D:9:6 |
| 6:D:9:8 | 6:D:9:9 | 6:D:A:1 | 6:D:A:2 |
| 6:D:A:4 | 6:D:A:6 | 6:D:A:8 | 6:D:A:9 |
| 6:D:D:6 | 6:D:D:9 | 6:D:E:6 | 6:D:E:9 |
| 6:E:4:6 | 6:E:4:9 | 6:E:5:6 | 6:E:5:7 |
| 6:E:5:9 | 6:E:5:B | 6:E:5:D | 6:E:5:E |
| 6:E:6:6 | 6:E:6:7 | 6:E:6:9 | 6:E:6:B |
| 6:E:6:D | 6:E:6:E | 6:E:7:6 | 6:E:7:9 |
| 6:E:8:6 | 6:E:8:9 | 6:E:9:6 | 6:E:9:7 |
| 6:E:9:9 | 6:E:9:B | 6:E:9:D | 6:E:9:E |
| 6:E:A:6 | 6:E:A:7 | 6:E:A:9 | 6:E:A:B |
| 6:E:A:D | 6:E:A:E | 6:E:B:6 | 6:E:B:9 |
| 7:1:4:6 | 7:1:4:9 | 7:1:8:6 | 7:1:8:9 |
| 7:2:1:6 | 7:2:1:9 | 7:2:2:6 | 7:2:2:9 |
| 7:4:4:6 | 7:4:4:9 | 7:4:8:6 | 7:4:8:9 |
| 7:8:1:6 | 7:8:1:9 | 7:8:2:6 | 7:8:2:9 |
| 8:1:4:6 | 8:1:4:9 | 8:1:8:6 | 8:1:8:9 |
| 8:2:1:6 | 8:2:1:9 | 8:2:2:6 | 8:2:2:9 |
| 8:4:4:6 | 8:4:4:9 | 8:4:8:6 | 8:4:8:9 |
| 8:8:1:6 | 8:8:1:9 | 8:8:2:6 | 8:8:2:9 |
| 9:1:4:6 | 9:1:4:9 | 9:1:5:6 | 9:1:5:7 |
| 9:1:5:9 | 9:1:5:B | 9:1:5:D | 9:1:5:E |
| 9:1:6:6 | 9:1:6:7 | 9:1:6:9 | 9:1:6:B |
| 9:1:6:D | 9:1:6:E | 9:1:7:6 | 9:1:7:9 |
| 9:1:8:6 | 9:1:8:9 | 9:1:9:6 | 9:1:9:7 |
| 9:1:9:9 | 9:1:9:B | 9:1:9:D | 9:1:9:E |
| 9:1:A:6 | 9:1:A:7 | 9:1:A:9 | 9:1:A:B |
| 9:1:A:D | 9:1:A:E | 9:1:B:6 | 9:1:B:9 |
| 9:2:1:6 | 9:2:1:9 | 9:2:2:6 | 9:2:2:9 |
| 9:2:5:1 | 9:2:5:2 | 9:2:5:4 | 9:2:5:6 |
| 9:2:5:8 | 9:2:5:9 | 9:2:6:1 | 9:2:6:2 |
| 9:2:6:4 | 9:2:6:6 | 9:2:6:8 | 9:2:6:9 |
| 9:2:9:1 | 9:2:9:2 | 9:2:9:4 | 9:2:9:6 |
| 9:2:9:8 | 9:2:9:9 | 9:2:A:1 | 9:2:A:2 |
| 9:2:A:4 | 9:2:A:6 | 9:2:A:8 | 9:2:A:9 |
| 9:2:D:6 | 9:2:D:9 | 9:2:E:6 | 9:2:E:9 |
| 9:3:1:6 | 9:3:1:7 | 9:3:1:9 | 9:3:1:B |
| 9:3:1:D | 9:3:1:E | 9:3:2:6 | 9:3:2:7 |
| 9:3:2:9 | 9:3:2:B | 9:3:2:D | 9:3:2:E |
| 9:3:4:1 | 9:3:4:2 | 9:3:4:4 | 9:3:4:6 |
| 9:3:4:8 | 9:3:4:9 | 9:3:7:1 | 9:3:7:2 |
| 9:3:7:4 | 9:3:7:6 | 9:3:7:8 | 9:3:7:9 |
| 9:3:8:1 | 9:3:8:2 | 9:3:8:4 | 9:3:8:6 |
| 9:3:8:8 | 9:3:8:9 | 9:3:B:1 | 9:3:B:2 |
| 9:3:B:4 | 9:3:B:6 | 9:3:B:8 | 9:3:B:9 |
| 9:3:D:6 | 9:3:D:7 | 9:3:D:9 | 9:3:D:B |
| 9:3:D:D | 9:3:D:E | 9:3:E:6 | 9:3:E:7 |
| 9:3:E:9 | 9:3:E:B | 9:3:E:D | 9:3:E:E |
| 9:4:4:6 | 9:4:4:9 | 9:4:5:6 | 9:4:5:7 |
| 9:4:5:9 | 9:4:5:B | 9:4:5:D | 9:4:5:E |
| 9:4:6:6 | 9:4:6:7 | 9:4:6:9 | 9:4:6:B |
| 9:4:6:D | 9:4:6:E | 9:4:7:6 | 9:4:7:9 |
| 9:4:8:6 | 9:4:8:9 | 9:4:9:6 | 9:4:9:7 |
| 9:4:9:9 | 9:4:9:B | 9:4:9:D | 9:4:9:E |
| 9:4:A:6 | 9:4:A:7 | 9:4:A:9 | 9:4:A:B |
| 9:4:A:D | 9:4:A:E | 9:4:B:6 | 9:4:B:9 |
| 9:6:1:6 | 9:6:1:7 | 9:6:1:9 | 9:6:1:B |
| 9:6:1:D | 9:6:1:E | 9:6:2:6 | 9:6:2:7 |
| 9:6:2:9 | 9:6:2:B | 9:6:2:D | 9:6:2:E |
| 9:6:4:1 | 9:6:4:2 | 9:6:4:4 | 9:6:4:6 |
| 9:6:4:8 | 9:6:4:9 | 9:6:7:1 | 9:6:7:2 |
| 9:6:7:4 | 9:6:7:6 | 9:6:7:8 | 9:6:7:9 |
| 9:6:8:1 | 9:6:8:2 | 9:6:8:4 | 9:6:8:6 |
| 9:6:8:8 | 9:6:8:9 | 9:6:B:1 | 9:6:B:2 |
| 9:6:B:4 | 9:6:B:6 | 9:6:B:8 | 9:6:B:9 |
| 9:6:D:6 | 9:6:D:7 | 9:6:D:9 | 9:6:D:B |
| 9:6:D:D | 9:6:D:E | 9:6:E:6 | 9:6:E:7 |
| 9:6:E:9 | 9:6:E:B | 9:6:E:D | 9:6:E:E |
| 9:7:1:6 | 9:7:1:9 | 9:7:2:6 | 9:7:2:9 |
| 9:7:5:1 | 9:7:5:2 | 9:7:5:4 | 9:7:5:6 |
| 9:7:5:8 | 9:7:5:9 | 9:7:6:1 | 9:7:6:2 |
| 9:7:6:4 | 9:7:6:6 | 9:7:6:8 | 9:7:6:9 |
| 9:7:9:1 | 9:7:9:2 | 9:7:9:4 | 9:7:9:6 |
| 9:7:9:8 | 9:7:9:9 | 9:7:A:1 | 9:7:A:2 |
| 9:7:A:4 | 9:7:A:6 | 9:7:A:8 | 9:7:A:9 |
| 9:7:D:6 | 9:7:D:9 | 9:7:E:6 | 9:7:E:9 |
| 9:8:1:6 | 9:8:1:9 | 9:8:2:6 | 9:8:2:9 |
| 9:8:5:1 | 9:8:5:2 | 9:8:5:4 | 9:8:5:6 |
| 9:8:5:8 | 9:8:5:9 | 9:8:6:1 | 9:8:6:2 |
| 9:8:6:4 | 9:8:6:6 | 9:8:6:8 | 9:8:6:9 |
| 9:8:9:1 | 9:8:9:2 | 9:8:9:4 | 9:8:9:6 |
| 9:8:9:8 | 9:8:9:9 | 9:8:A:1 | 9:8:A:2 |
| 9:8:A:4 | 9:8:A:6 | 9:8:A:8 | 9:8:A:9 |
| 9:8:D:6 | 9:8:D:9 | 9:8:E:6 | 9:8:E:9 |
| 9:9:1:6 | 9:9:1:7 | 9:9:1:9 | 9:9:1:B |
| 9:9:1:D | 9:9:1:E | 9:9:2:6 | 9:9:2:7 |
| 9:9:2:9 | 9:9:2:B | 9:9:2:D | 9:9:2:E |
| 9:9:4:1 | 9:9:4:2 | 9:9:4:4 | 9:9:4:6 |
| 9:9:4:8 | 9:9:4:9 | 9:9:7:1 | 9:9:7:2 |
| 9:9:7:4 | 9:9:7:6 | 9:9:7:8 | 9:9:7:9 |
| 9:9:8:1 | 9:9:8:2 | 9:9:8:4 | 9:9:8:6 |
| 9:9:8:8 | 9:9:8:9 | 9:9:B:1 | 9:9:B:2 |
| 9:9:B:4 | 9:9:B:6 | 9:9:B:8 | 9:9:B:9 |
| 9:9:D:6 | 9:9:D:7 | 9:9:D:9 | 9:9:D:B |
| 9:9:D:E | 9:9:D:E | 9:9:E:6 | 9:9:E:7 |
| 9:9:E:9 | 9:9:E:B | 9:9:E:D | 9:9:E:E |
| 9:B:4:6 | 9:B:4:9 | 9:B:5:6 | 9:B:5:7 |
| 9:B:5:9 | 9:B:5:B | 9:B:5:D | 9:B:5:E |
| 9:B:6:6 | 9:B:6:7 | 9:B:6:9 | 9:B:6:B |
| 9:B:6:D | 9:B:6:E | 9:B:7:6 | 9:B:7:9 |
| 9:B:8:6 | 9:B:8:9 | 9:B:9:6 | 9:B:9:7 |
| 9:B:9:9 | 9:B:9:B | 9:B:9:D | 9:B:9:E |
| 9:B:A:6 | 9:B:A:7 | 9:B:A:9 | 9:B:A:B |
| 9:B:A:D | 9:B:A:E | 9:B:B:6 | 9:B:B:9 |
| 9:C:1:6 | 9:C:1:7 | 9:C:1:9 | 9:C:1:B |
| 9:C:1:D | 9:C:1:E | 9:C:2:6 | 9:C:2:7 |
| 9:C:2:9 | 9:C:2:B | 9:C:2:D | 9:C:2:E |
| 9:C:4:1 | 9:C:4:2 | 9:C:4:4 | 9:C:4:6 |
| 9:C:4:8 | 9:C:4:9 | 9:C:7:1 | 9:C:7:2 |
| 9:C:7:4 | 9:C:7:6 | 9:C:7:8 | 9:C:7:9 |
| 9:C:8:1 | 9:C:8:2 | 9:C:8:4 | 9:C:8:6 |
| 9:C:8:8 | 9:C:8:9 | 9:C:B:1 | 9:C:B:2 |
| 9:C:B:4 | 9:C:B:6 | 9:C:B:8 | 9:C:B:9 |
| 9:C:D:6 | 9:C:D:7 | 9:C:D:9 | 9:C:D:B |
| 9:C:D:D | 9:C:D:E | 9:C:E:6 | 9:C:E:7 |
| 9:C:E:9 | 9:C:E:B | 9:C:E:D | 9:C:E:E |
| 9:D:1:6 | 9:D:1:9 | 9:D:2:6 | 9:D:2:9 |
| 9:D:5:1 | 9:D:5:2 | 9:D:5:4 | 9:D:5:6 |
| 9:D:5:8 | 9:D:5:9 | 9:D:6:1 | 9:D:6:2 |
| 9:D:6:4 | 9:D:6:6 | 9:D:6:8 | 9:D:6:9 |
| 9:D:9:1 | 9:D:9:2 | 9:D:9:4 | 9:D:9:6 |
| 9:D:9:8 | 9:D:9:9 | 9:D:A:1 | 9:D:A:2 |
| 9:D:A:4 | 9:D:A:6 | 9:D:A:8 | 9:D:A:9 |
| 9:D:D:6 | 9:D:D:9 | 9:D:E:6 | 9:D:E:9 |
| 9:E:4:6 | 9:E:4:9 | 9:E:5:6 | 9:E:5:7 |
| 9:E:5:9 | 9:E:5:B | 9:E:5:D | 9:E:5:E |
| 9:E:6:6 | 9:E:6:7 | 9:E:6:9 | 9:E:6:B |
| 9:E:6:D | 9:E:6:E | 9:E:7:6 | 9:E:7:9 |
| 9:E:8:6 | 9:E:8:9 | 9:E:9:6 | 9:E:9:7 |
| 9:E:9:9 | 9:E:9:B | 9:E:9:D | 9:E:9:E |
| 9:E:A:6 | 9:E:A:7 | 9:E:A:9 | 9:E:A:B |
| 9:E:A:D | 9:E:A:E | 9:E:B:6 | 9:E:B:9 |
| B:1:7:6 | B:1:7:9 | B:1:B:6 | B:1:B:9 |
| B:2:7:6 | B:2:D:9 | B:2:E:6 | B:2:E:9 |
| B:4:7:6 | B:4:7:9 | B:4:B:6 | B:4:B:9 |
| B:8:D:6 | B:8:D:9 | B:8:E:6 | B:8:E:9 |
| D:7:1:6 | D:7:1:9 | D:7:2:6 | D:7:2:9 |
| D:B:4:6 | D:B:4:9 | D:B:8:6 | D:B:8:9 |
| D:D:1:6 | D:D:1:9 | D:D:2:6 | D:D:2:9 |
| D:E:4:6 | D:E:4:9 | D:E:8:6 | D:E:8:9 |
| E:7:D:6 | E:7:D:9 | E:7:E:6 | E:7:E:9 |
| E:B:7:6 | E:B:7:9 | E:B:B:6 | E:B:B:9 |
| E:D:D:6 | E:D:D:9 | E:D:E:6 | E:D:E:9 |
| E:E:7:6 | E:E:7:9 | E:E:B:6 | E:E:B:9 |

It will now be understood that what has been disclosed herein comprises a programmable logic device which provides a functionally redundant architecture with a substantially enhanced probability of functionality despite the presence of faults thus rendering the device more reliable in the field and more likely to provide greater production yields. Furthermore, functional redundancy renders the device suitable for use in adaptable problem solving machines where problems may be numeric such as mathematical calculations as well as nonnumeric such as pattern recognition. A number of illustrative embodiments have been disclosed. In one such embodiment the logic structure comprises a combinational logic device in the form of a complete gate structure comprising a three input gate constructed from six two variable input gates. A number of additional embodiments are disclosed, each of which is at least initially logically redundant and some of which are shown to undergo simplifications where atoms or nodes of a particular network are fixed or omitted whereby the total number of logical control options has been reduced.

The unique functional redundancy feature of the logical architectures of the present invention, including the specific embodiments shown herein, results in a logical device which can be manufactured in the form of VLSI chips and have the advantage of being programmable in production and in the field, have increased production yields, greater reliability, be tolerant of faults, and have the potential of being an important building block for adaptive network systems. Means for programming an embodiment of the invention and means for automatically reconfiguring fault-detecting networks of the invention, have been disclosed. Numerous modifications and additions will now occur to those having relevant skill as a result of the teaching disclosed herein. By way of example, it will now be recognized that the advantageous feature of functional redundancy is not necessarily limited to logical networks which are complete. In fact the novel application of functional redundancy results in identical or similar advantages in incomplete networks where redundancy in such instances would have the same definition indicated above, namely, the number of control states divided by the number of functions being greater than 1. The only distinction is that the number of functions would not be determined analytically by merely addressing the number of input variables, but would depend upon the number of functions expected of the device, it being recognized beforehand that the device is not expected to be complete for the particular purposes for which it is utilized. Furthermore, other programs and computer-controlled fault detection and reconfiguration apparatus suitable for use with the invention will now become apparent as a result of this disclosure. In any case, such additions and modifications, including the concept of functional redundancy in incomplete logic networks, are contemplated as being within the scope of the present invention which is to be limited only by the claims appended hereto.

We claim:

1. A programmable logic gate structure having a plurality of data input variables and comprising:
   a hierarchial array of multi-variable input gates, at least one such gate having a plurality of gate control input lines for selecting operation of said gate in accordance with any one of a plurality of possible Boolean logic functions for the number of data input variables; said gates comprising:
   a plurality of memory devices, at least one such memory device being associated respectively with each such gate and being connected to said gate control input lines for selecting said gate operation;
   register means being associated respectively with each such memory device for sequentially selecting the output of said memory devices for application to said gate control lines;
   means for activating said register means for applying selected binary signals from said memory devices to said gates for presenting a selected Boolean logic function to said data input variables; and
   means for generating said selected binary signals in response to a functional expression of said selected Boolean logic function.

2. The logic gate structure recited in claim 1 wherein the number of control lines is greater than the minimum required to select all of the logic functions of said gate structure.

3. The logic gate structure recited in claim 1 wherein said structure is implemented in a VLSI integrated circuit chip.

4. The logic gate structure recited in claim 1 further comprising:
   means for selectively fixing all of said memory devices for respective application of constant output signals to said control lines for selecting any one of the possible Boolean logic functions for the number of variable signals input to said logic gate structure.

5. A three-variable programmable logic gate structure comprising:
   a hierarchial array of six replicated two-variable input gates, at least one such gate having four control input lines for selecting operation of said gate in accordance with any one of a plurality of Boolean logic functions for two variable inputs; said gates comprising:
   a plurality of memory devices, at least one such memory device being associated respectively with each such gate and being connected to said gate control input lines for selecting said gate operation;
   register means being associated respectively with each such memory device for sequentially selecting the output of said memory devices for application to said gate control lines;
   means for activating said register means for applying selected binary signals from said memory devices to said gates for presenting a selected Boolean logic function; and
   means for generating said selected binary signals in response to a functional expression of said selected Boolean logic function.

6. The logic gate structure recited in claim 5 wherein the total number of control input lines is more than 8 whereby all two hundred fifty six Boolean logic functions of three input variables may be selected by said activating means despite the presence of a fault in at least one of said gates.

7. The logic gate structure recited in claim 5 wherein the number of control lines is greater than the minimum required to select all of the logic functions of said gate structure.

8. The logic gate structure recited in claim 5 wherein said structure is implemented in a VLSI integrated circuit chip.

9. The logic gate structure recited in claim 5 further comprising:
   means for selectively fixing all of said memory devices for respective application of constant output signals to said control lines for selecting any one of the possible Boolean logic functions for the number of variable signals input to said logic gate structure.

10. A programmable logical gate structure having a minimum of three input variables and comprising:
   a plurality of interconnected replicated gates, at least one such gate having a plurality of directly accessible control input lines for selecting a logic function in accordance with any one of a plurality of possible Boolean logic functions for the number of variables input to the gate; said gates comprising:
   means for generating signals to be applied to each gate on said control lines for limiting logic operation in accordance with a selected function for each said gate structure; and
   control means connected to said generating means for applying generated signals to each said gate in a predetermined combination for presenting a selected Boolean logic function to said gate structure input variables, the number of Boolean logic functions of said gate structure being equal to the maximum number possible for the number of input variables; said structure further comprising:
   programmable means connected to each said control means and responsive to a functional expression of said selected Boolean logic function for selecting all generated signals on said control lines.

11. The logic gate structure recited in claim 10 wherein the total number of control input lines is greater than 2 raised exponentially to the number of input variables whereby all possible Boolean logic functions of the number of input variables may be selected by said control means despite the presence of a fault in at least one of said gates.

12. The logic gate structure recited in claim 10 wherein the number of gates and control input lines is sufficient to render said gate structure logically redundant.

13. The logic gate structure recited in claim 10 wherein said structure is implemented in a VLSI integrated chip.

14. The logic gate structure recited in claim 10 further comprising:

means for selectively fixing said generating means for respective application of constant output signals to said control lines for selecting any one of the possible Boolean logic functions for the number of variable signals input to said logic gate structure.

15. A programmable functionally redundant and complete logic gate structure having a plurality of input data lines and at least one output data line and comprising a plurality of interconnected gates, at least one of said gates having as inputs a plurality of control lines for selecting one of a plurality of possible logic function states of said gate in accordance with the selected combination of signal states of said control lines, the total number of said control line signal state combinations of all of said gates in said structure being greater than the number of Boolean logic functions of said gate structure, the number of Boolean logic functions of said gate structure being equal to the maximum number possible for the number of data lines input to said gate structure, and
   programmable means for generating signals to be applied to each gate on said control lines for limiting logic operation in accordance with a selected function for said gate structure.

16. The logic gate structure recited in claim 15 wherein said gates are interconnected in a hierarchial array.

17. The logic gate structure recited in claim 15 wherein at least one of said gates has a fixed unitary function.

18. A functionally redundant and comlete logic gate structure having a plurality of input data lines and at least one output data line and comprising six gates, at least two of said gates having four control lines each for selecting any one of at least 256 Boolean logic functions for said gate structure, the total number of said control line signal state combinations of all of said gates in said structure being greater than the number of Boolean logic functions of said gate structure, and
   programmable means for generating signals to be applied to each gate on said control lines for limiting logic operation in accordance with a selected function for said gate structure.

* * * * *